(12) United States Patent
Lambertson et al.

(10) Patent No.: US 8,254,196 B2
(45) Date of Patent: Aug. 28, 2012

(54) ARRAY OPERATION USING A SCHOTTKY DIODE AS A NON OHMIC SELECTION DEVICE

(75) Inventors: Roy Lambertson, Los Altos, CA (US); Lawrence Schloss, Palo Alto, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 13/246,654

(22) Filed: Sep. 27, 2011

(65) Prior Publication Data
US 2012/0020143 A1    Jan. 26, 2012

Related U.S. Application Data

(63) Continuation of application No. 12/584,262, filed on Sep. 2, 2009, now Pat. No. 8,027,215.

(60) Provisional application No. 61/203,189, filed on Dec. 19, 2008, provisional application No. 61/203,163, filed on Dec. 19, 2008, provisional application No. 61/203,160, filed on Dec. 19, 2008, provisional application No. 61/203,184, filed on Dec. 19, 2008, provisional application No. 61/203,187, filed on Dec. 19, 2008, provisional application No. 61/203,912, filed on Dec. 30, 2008.

(51) Int. Cl.
*G11C 7/00* (2006.01)

(52) U.S. Cl. ..................... 365/218; 365/163

(58) Field of Classification Search ............... 365/218, 365/163
See application file for complete search history.

(56) References Cited

U.S. PATENT DOCUMENTS

| | | | |
|---|---|---|---|
| 7,972,913 B2 * | 7/2011 | Lin et al. ................. | 438/167 |
| 2003/0040144 A1 * | 2/2003 | Blanchard et al. ........ | 438/145 |
| 2007/0075362 A1 * | 4/2007 | Wu ......................... | 257/335 |

* cited by examiner

*Primary Examiner* — Michael Tran
(74) *Attorney, Agent, or Firm* — Stolowitz Ford Cowger LLP

(57) ABSTRACT

A two-terminal memory cell including a Schottky metal-semiconductor contact as a selection device (SD) allows selection of two-terminal cross-point memory array operating voltages that eliminate "half-select leakage current" problems present when other types of non-ohmic devices are used. The SD structure can comprise a "metal/oxide semiconductor/metal" or a "metal/lightly-doped single layer polycrystalline silicon." The memory cell can include a two-terminal memory element including at least one conductive oxide layer (e.g., a conductive metal oxide—CMO, such as a perovskite or a conductive binary oxide) and an electronically insulating layer (e.g., yttria-stabilized zirconia—YSZ) in contact with the CMO. The SD can be included in the memory cell and configured electrically in series with the memory element. The memory cell can be positioned in a two-terminal cross-point array between a pair of conductive array lines (e.g., a bit line and a word line) across which voltages for data operations are applied.

40 Claims, 16 Drawing Sheets

US 8,254,196 B2

ARRAY OPERATION USING A SCHOTTKY DIODE AS A NON OHMIC SELECTION DEVICE

RELATED APPLICATIONS

This application is a continuation of and claims priority to U.S. patent application Ser. No. 12/584,262, filed Sep. 2, 2009, now issued as U.S. Pat. No. 8,027,215, which is a non-provisional of and claims priority to U.S. Provisional Patent Application No. 61/203,189, filed Dec. 19, 2008, to U.S. Provisional Patent Application No. 61/203,163, filed Dec. 19, 2008, to U.S. Provisional Patent Application No. 61/203,160, filed on Dec. 19, 2008, to U.S. Provisional Patent Application No. 61/203,184, filed on Dec. 19, 2008, to U.S. Provisional Patent Application No. 61/203,187, filed on Dec. 19, 2008, and to U.S. Provisional Patent Application No. 61/203,912, filed on Dec. 30, 2008, all of which is incorporated herein by reference in their entirety.

FIELD OF THE INVENTION

The present invention relates generally to semiconductors and memory technology. More specifically, the present invention relates to a memory cell including a non-ohmic isolation device.

BACKGROUND OF THE INVENTION

Large arrays of two-terminal memory cells can require an isolation device (non-ohmic device—NOD) in order to avoid having substantial current flow through unselected or half-selected memory cells. Conventional approaches include using a metal-insulator-metal (MIM) diode as a device through which current can flow in either polarity of applied voltages during data operations (e.g., read and write operations) to a selected memory cell. However, in some configurations, the MIM diode can exhibit a sufficiently high "half-select" leakage ratio, that is, some current continues to flow through half-selected memory cells.

It is desirable to eliminate leakage currents associated with half-selected and un-selected memory cells during data operations, especially during read operations where the leakage currents can reduce the ability of sense circuitry to accurately sense a read current generated by one or more selected memory cells. Leakage currents can reduce a signal to noise ratio (S/N) resulting in read errors. Therefore, a high the S/N ratio is desirable and reducing or eliminating leakage currents can improve the S/N ratio. Furthermore, a high S/N ratio can reduce the complexity and size of the sense amp circuitry used for reading data from memory cells during read operations.

Reference is now made to FIG. 1A, where a schematic of a conventional memory array 150 includes a plurality of memory cells 100 arranged in a cross-point configuration with each cell 100 including a conventional MIM diode 106 electrically in series with a memory element 121, a first terminal 102, and a second terminal 104. The first terminal 102 is electrically coupled with a conductive array line 112 (e.g., a column line) and the second terminal 104 is electrically coupled with a conductive array line 110 (e.g., a row line). The conventional MIM diode 106 comprises a conventional non-ohmic isolation device. The array 150 depicts three row conductive array lines denoted as row-1, row-2, and row-3, and three column conductive array lines denoted as col-1, col-2, and col-3. The array 150 can include fewer or more conductive array lines and memory cells 100 than depicted in FIGS. 1A and 1B.

In FIG. 1A, voltage potentials for a data operation (e.g., a read or write operation) are applied to the row-2 and col-2 conductive array lines (depicted in heavy line) to select a specific memory cell 100' in the array 150 for the data operation. Here the data operation is a write operation to program the selected memory cell 100' (e.g., a programming operation). A voltage potential +V1 is applied to conductive array line row-2 and a voltage potential -V1 is applied to conductive array line col-2 such that the potential difference across the selected memory cell 100' is: +V1-(-V1)=+2V1. A potential of 0V is applied to all remaining conductive array lines. Accordingly, a table 170 depicts the potential difference across the memory cells 100 in the array 150. Memory cells 100 having only one of their two terminals (102 or 104) electrically coupled with the row-2 or col-2 conductive array lines are half-selected memory cells 100 because they have one terminal at 0V and other terminal at +V1 or -V1. Therefore, the potential difference across those memory cells 100 is +V1 (e.g., +V1-0V or 0V-(-V1)). Similarly, memory cells 100 having both terminals (102 and 104) electrically coupled with conductive array lines at the 0V potential are un-selected memory cells 100 with a potential difference across those memory cells 100 being approximately 0V.

Turning now to FIG. 1B, the array 150 is schematically depicted during an erase operation to the same selected memory cell 100'. Here, the polarity of the applied voltages on conductive array lines row-2 and col-2 is the opposite of that depicted in FIG. 1A such that the voltage applied to row-2 is -V1 and the voltage applied to col-2 is +V1 resulting in a potential difference across the selected memory cell 100' of: -V1-(+V1)=-2V1. A table 190 depicts the potential difference across all the memory cells 100 in the array 150 with un-selected memory cells 100 having a potential difference of approximately 0V and half-selected memory cells 100 having a potential difference of -V1.

Moving now to FIG. 2, an I-V curve for the memory cells 100 with the conventional MIM diode non-ohmic isolation device 106 depicts current flow I (on the y-axis) through a memory cell 100 as a function of the voltage V (on the x-axis) applied across the memory cell 100. For program and erase operations on the memory cell 100 (e.g., selected memory cell 100'), the magnitude of the current I is highest at operating point 212 for the applied voltage of +2V1 and operating point 214 for the applied voltage -2V1. The magnitude of current I is expected at those levels of applied voltage for a selected memory cell 100' because that cell is being programmed or erased. However, for half-selected and un-selected memory cells, some current I still flows as depicted at operating points 215 and 217 for applied voltages of +V1 and -V1, respectively. Although operating points 215 and 217 are depicted at +V1 and -V1, moving along the voltage axis from -V1 to 0V or +V1 to 0V, some current I still flows through memory cells 100. For example, if the applied voltage across un-selected memory cells 100 is not exactly 0V, then a voltage potential exists across those memory cells 100 and some leakage current can flow through those cells.

Although the FIGS. 1A through 2 depict applied voltages for program and erase operations, for read operations where the magnitude of the voltage applied across the selected memory cell 100' is typically less than that applied for program and erase operations, there will still be un-selected and half-selected memory cells in the array 150 having a potential difference across their terminals (102, 104) that can generate leakage currents that lower the aforementioned S/N ratio during read operations. Ideally, a non-ohmic device would allow current to flow only through selected memory cells 100' and would block current flow through half-selected and un-selected memory cells 100. Preferably, the operating points for half-selected and un-selected memory cells 100 would be on the voltage axis V where the current I is 0 A.

There are continuing efforts to improve selection devices for non-volatile memory.

BRIEF DESCRIPTION OF THE DRAWINGS

Various examples are disclosed in the following detailed description and the accompanying drawings.

Figure 1A:
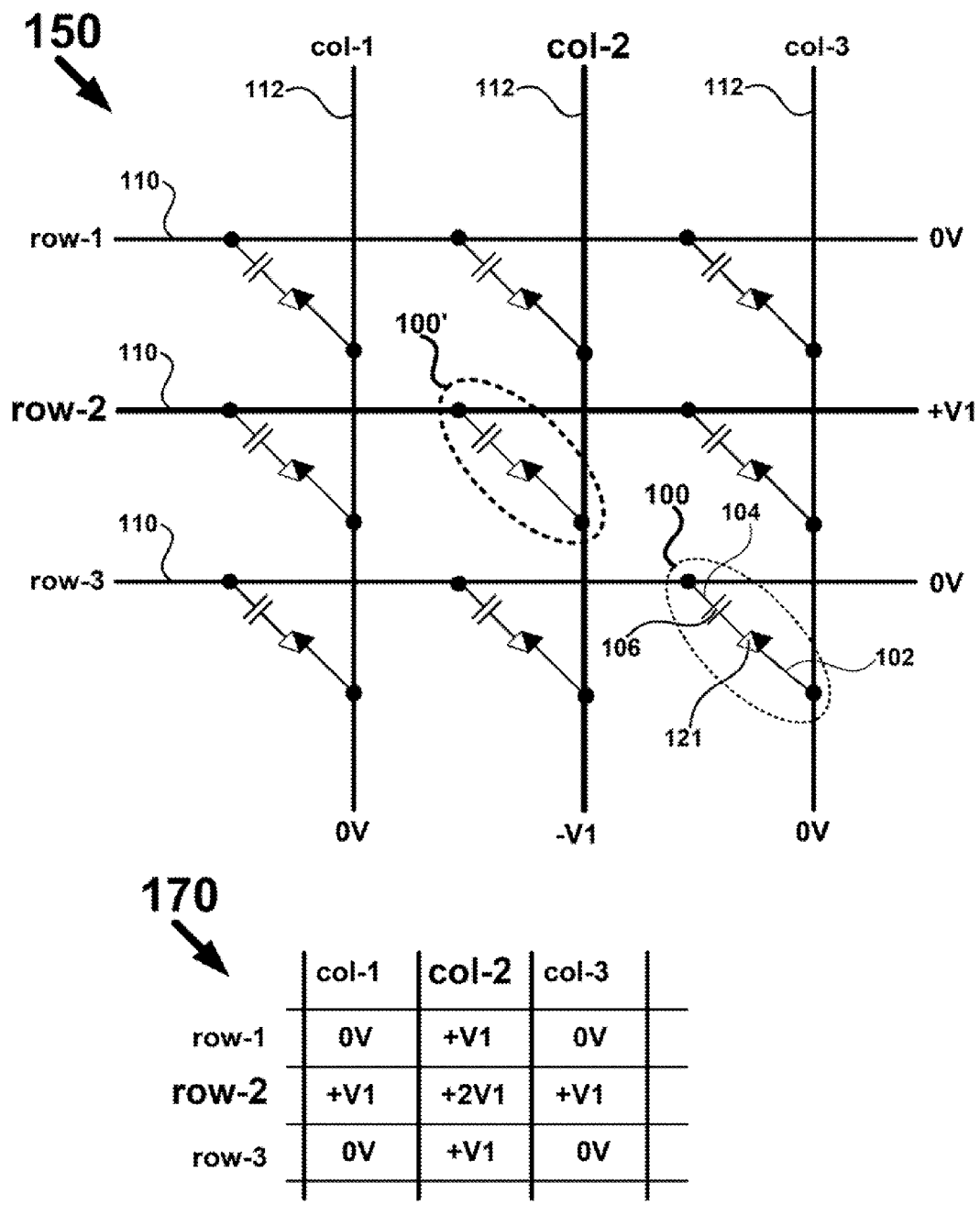
FIG. 1A depicts a schematic view of a conventional memory array during a programming operation to a memory cell including a conventional MIM diode NOD.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, entitled "Memory Using Mixed Valence Conductive Oxides," and published as U.S. Pub. No. US 2006/0171200 A1 on Aug. 3, 2006, is herein incorporated by reference in its entirety and for all purposes and describes non-volatile third dimensional memory elements that may be arranged in a two-terminal, cross-point memory array. The memory elements can be a component of a memory cell that includes electrically in series with the memory element, other structures including but not limited to a non-ohmic device (NOD) and electrodes. New non-volatile memory structures are possible with the capability of this third dimensional memory array. The technology allows for the emulation of other memory technologies by duplicating the interface signals and protocols, while accessing the third dimensional memory array. The third dimensional memory array may emulate other types of memory (e.g., DRAM, SRAM, FLASH, and ROM), providing memory combinations (e.g., DRAM, FLASH, and SRAM) within a single component. In at least some embodiments, a two-terminal memory cell can be configured to change conductivity when exposed to an appropriate voltage drop across the two-terminals. The memory cell can include an electrolytic tunnel barrier and a mixed valence conductive oxide (e.g., a memory element) in some embodiments, as well as multiple mixed valence conductive oxide structures in other embodiments. A voltage drop across the electrolytic tunnel barrier can cause an electrical field within the mixed valence conductive oxide that is strong enough to move oxygen ions out of the mixed valence conductive oxide, according to some embodiments.

In some embodiments, an electrolytic tunnel barrier and one or more mixed valence conductive oxide structures do not need to operate in a silicon substrate, and, therefore, can be fabricated (e.g., back-end-of-the-line BEOL) above circuitry being used for other purposes (e.g., circuitry fabricated front-end-of-the-line FEOL). The circuitry portion of an IC can be fabricated FEOL on a substrate (e.g., a silicon Si wafer) that is partitioned into die with each die forming the base structure for the IC. After the FEOL processing is completed the substrate is processed BEOL to fabricate the one or more layers of memory directly on top of each FEOL die. An inter-level interconnect structure formed FEOL serves as the structural and electrical foundation for the subsequent formation of the one or more layers of memory that will be deposited (e.g., formed) on top of the FEOL die. The inter-level interconnect structure includes vias, plugs, damascene structures or the like, that allow the FEOL circuitry to be electrically coupled with the BEOL memory layer(s). After BEOL processing is completed, the finished die can be singulated from the substrate (e.g., removed by sawing or cutting) to form individual die that can be inserted into a suitable package and electrically coupled with bonding pads or other structures in the package to form an integrated circuit (IC). Therefore, each die is an integral unit that includes at a bottommost layer the FEOL circuitry and upper layers comprised of one or more layers of third dimensional memory that are positioned above the FEOL circuitry layer. Unlike conventional IC's that have conventional memory (e.g., SRAM, DRAM, and FLASH) fabricated FEOL on the same substrate die as the circuitry that accesses the memory such that the memory and the circuitry are disposed on the same physical plane, the BEOL third dimensional memory layer(s) are not on the same plane as the FEOL circuitry and therefore do not take up area on the FEOL die. Accordingly, data storage can be increased without increasing the area of the FEOL die by fabricating additional BEOL memory layers on top of the FEOL die (e.g., along the +Z axis of FIGS. 7B-8C).

Further, a two-terminal memory cell can be arranged in a cross-point configuration such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having electrically isolated X and Y direction lines (e.g., using a dielectric material such as $SiO_2$). When a first write voltage, VW1, is applied across the memory cell (e.g., by applying ½ VW1 to the X-direction line and ½–VW1 to the Y-direction line), the memory cell can switch to a low resistive state. When a second write voltage, VW2, is applied across the memory cell (e.g., by applying ½ VW2 to the X-direction line and ½–VW2 to the Y-direction line), the memory cell can switch to a high resistive state. Memory cells using electrolytic tunnel barriers and mixed valence conductive oxides can have VW1 opposite in polarity from VW2.

Figure 3A:
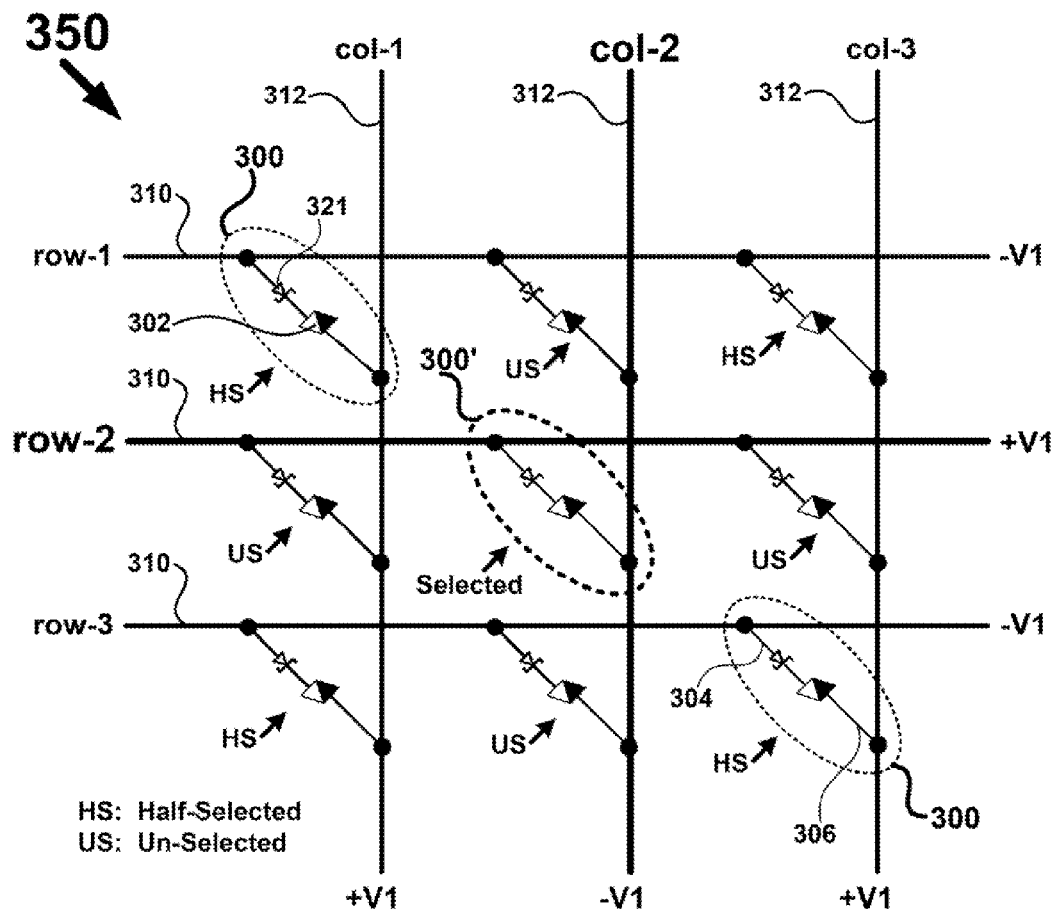
FIG. 3A depicts a schematic view of a memory array during a programming operation to a memory cell including a single Schottky diode NOD isolation device according to the present invention.

Attention is now directed to FIG. 3A where a schematic of a memory array 350 is depicted. The array 350 is a 3×3 array with three row conductors denoted as row-1, row-2, and row-3 and three columns conductors denoted as col-1, col-2, and col-3; however, the array 350 can be any size and is not limited to the 3×3 array depicted in FIG. 3A. The array 350 can include a plurality of two-terminal memory cells 300 positioned in a cross-point array configuration with each memory cell 300 including a first terminal 304 electrically coupled with one of the row conductors and a second terminal 306 electrically coupled with one of the column conductors. Each memory cell 300 further includes a two-terminal memory element 302 and a single Schottky diode 321 non-ohmic isolation device (NOD) that are electrically in series with each other and electrically in series with the terminals 304 and 306.

Data operations (e.g., read and write operations) on the memory cells 300 require appropriate voltage potentials be applied to selected conductive array lines. In FIG. 3A a write operation (e.g., a programming operation) to the memory cell 300 in (row-2, col-2) is accomplished by applying a voltage potential of +V1 to conductor row-2 and a voltage potential –V1 to conductor col-2 to select the memory cell 300 for a programming operation. The selected memory cell is denoted as 300'. The remaining row conductors have voltage potential of –V1 applied to them and the remaining column conductors have a voltage potential of +V1 applied to them. A programming table 370 depicts the voltage across the selected memory cell 300' and across un-selected memory cells 300. In table 370, the selected memory cell 300' has a potential difference of +2V1 across its terminals (304, 306) and un-selected memory cells 300 have a 0V or a –2V1 potential difference across their terminals (304, 306). The applied voltages can be shifted up or down relative to what is depicted in FIG. 3A and are not limited to the +V1 and –V1 shown. Here, the terminology un-selected memory cell 300 means any memory cell 300 that is not the selected memory cell 300' even though some of the memory cells 300 can be designated as half-selected memory cells 300. To clarify the status of the cells 300 in the array 350 using standard parlance, in the programming operation in FIG. 3A, cells 300 denoted as HS are half-selected memory cells and cells 300 denoted as US are un-selected memory cells.

Figure 1B:
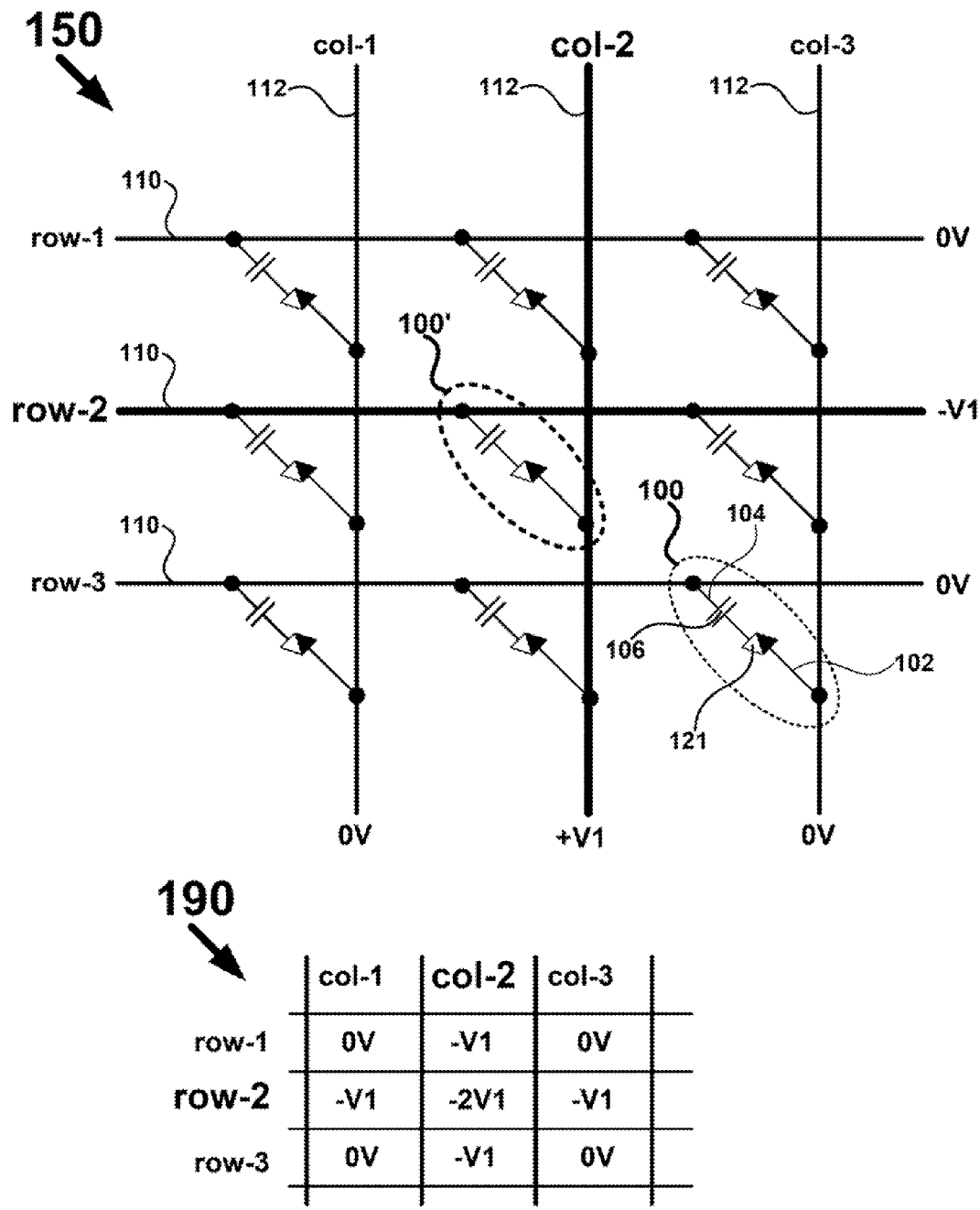
FIG. 1B depicts a schematic view of a conventional memory array during an erase operation to a memory cell including a conventional MIM diode NOD.
Figure 2:
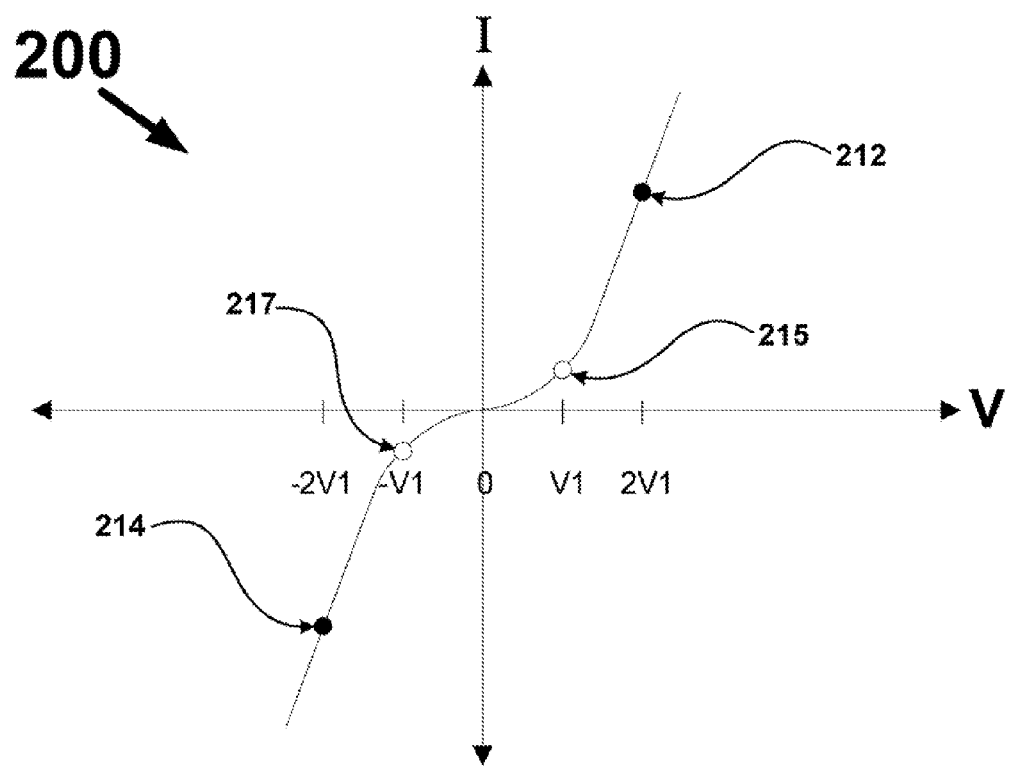
FIG. 2 depicts an I-V curve for a memory cell including a conventional MIM diode NOD.

The asymmetrical characteristics of the single Schottky diode 321 and 621 (see 621 in FIGS. 6A-6D) allow tolerable levels of unselected cell 300 leakage in the array 350 (e.g., approximately a 4000:1 current ratio between the selected device 300' and an unselected devices 300 with the same voltage at reverse polarity). Essentially, the reverse leakage characteristics of the single Schottky diode 321 are expected to be better than the half-selected leakage characteristics of the conventional MIM diode 106 described above in reference to FIGS. 1A-2.

Unlike the conventional MIM device 106 described above in reference to FIGS. 1A and 1B, the Schottky diode (321, 621) is not subject to dielectric breakdown failure mechanisms such as time-dependent dielectric breakdown or stress-induced leakage current. The current and total fluence ($C/cm^2$) that may be passed through the single Schottky diode (321, 621) before failure is much higher than that of the conventional MIM diode 106. The single Schottky diode (321, 621) has a well-controlled reverse breakdown voltage; sector erase is possible by biasing the diodes (321, 621) on multiple cells 300 into reverse breakdown.

Figure 3B:
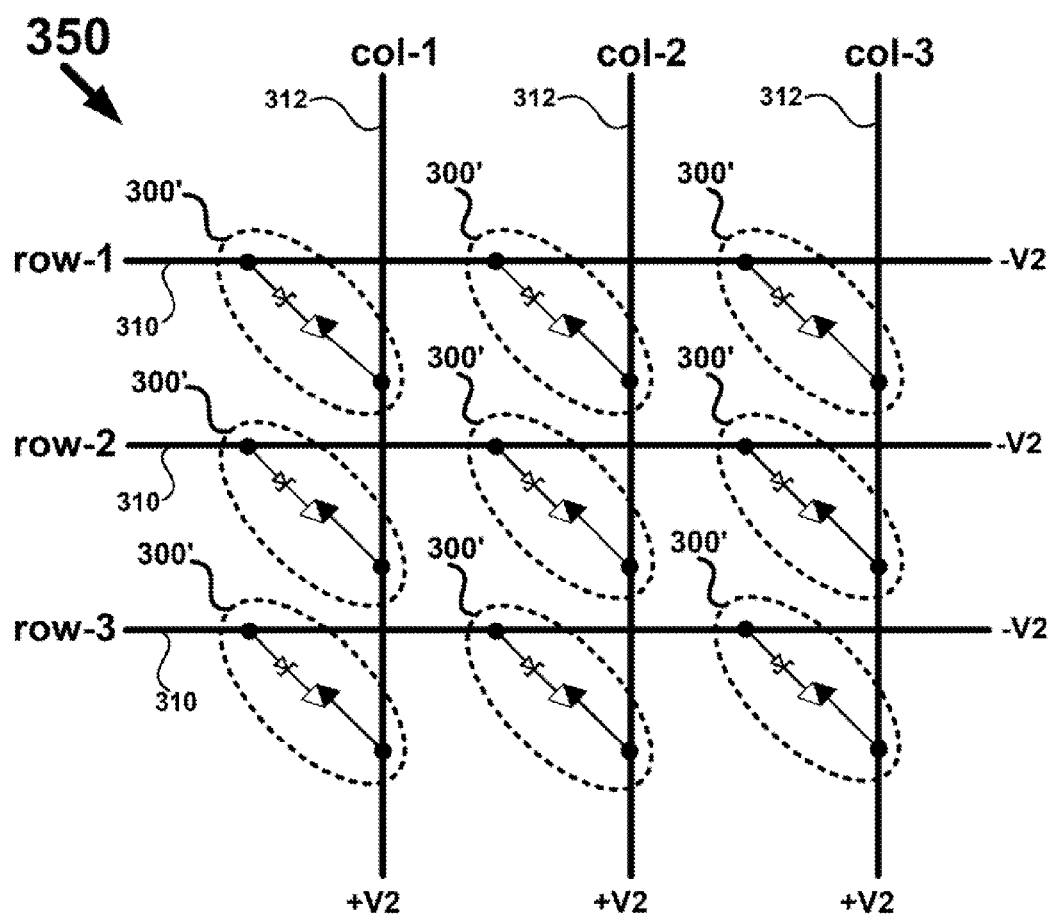
FIG. 3B depicts a schematic view of a memory array during a sector erase operation to memory cells including a single Schottky diode NOD isolation devices according to the present invention.

Reference is now made to FIG. 3B where a schematic depicts a sector erase operation (also referred to as a block erase operation) to the array 350. Here, all the row conductors 310 have an applied voltage potential of –V2 and all the column conductors 312 have an applied voltage potential of +V2. Consequently, all the memory cells are selected for the erase operation and are denoted as selected memory cells 300'. In an erase table 380, the potential difference across the terminals (304, 306) of selected memory cells 300' is −2V2, that is: −V2−(+V2)=−2V2.

Variations on the erase operation of FIG. 3B can include erasing the memory cells 300' in a selected column of the array 350 or in a selected row of the array 350. As one example of how the memory cells 300' in a selected column can be erased, column conductors col-1 and col-2 can have a voltage potential of approximately 0V applied to them, col-3 can have a voltage potential of +V2 applied to it, and row conductors row-1, row-2, and row-3 can have a voltage potential of −V2 applied to them. Consequently, all of the memory cells 300 in col-1 and col-2 are half-selected during the erase operation with a potential difference of −V2 (e.g., −V2−0V) across their terminals and in col-3 all of the memory cells 300' are selected for the erase operation and have a potential difference of −2V2 (e.g., −V2−(+V2)) across their terminals.

As another example of how all the memory cells 300' in a selected row can be erased, row conductors row-1 and row-3 can have a voltage potential of approximately 0V applied to them, row-2 can have a voltage potential of −V2 applied to it, and column conductors col-1, col-2, and col-3 can have a voltage potential of +V2 applied to them. Consequently, all of the memory cells 300 in row-1 and row-3 are half-selected during the erase operation with a potential difference of +V2 (e.g., 0V−(−V2)) across their terminals and in row-2 all of the memory cells 300' are selected for the erase operation and have a potential difference of −2V2 (e.g., −V2−(+V2)) across their terminals.

Figure 3C:
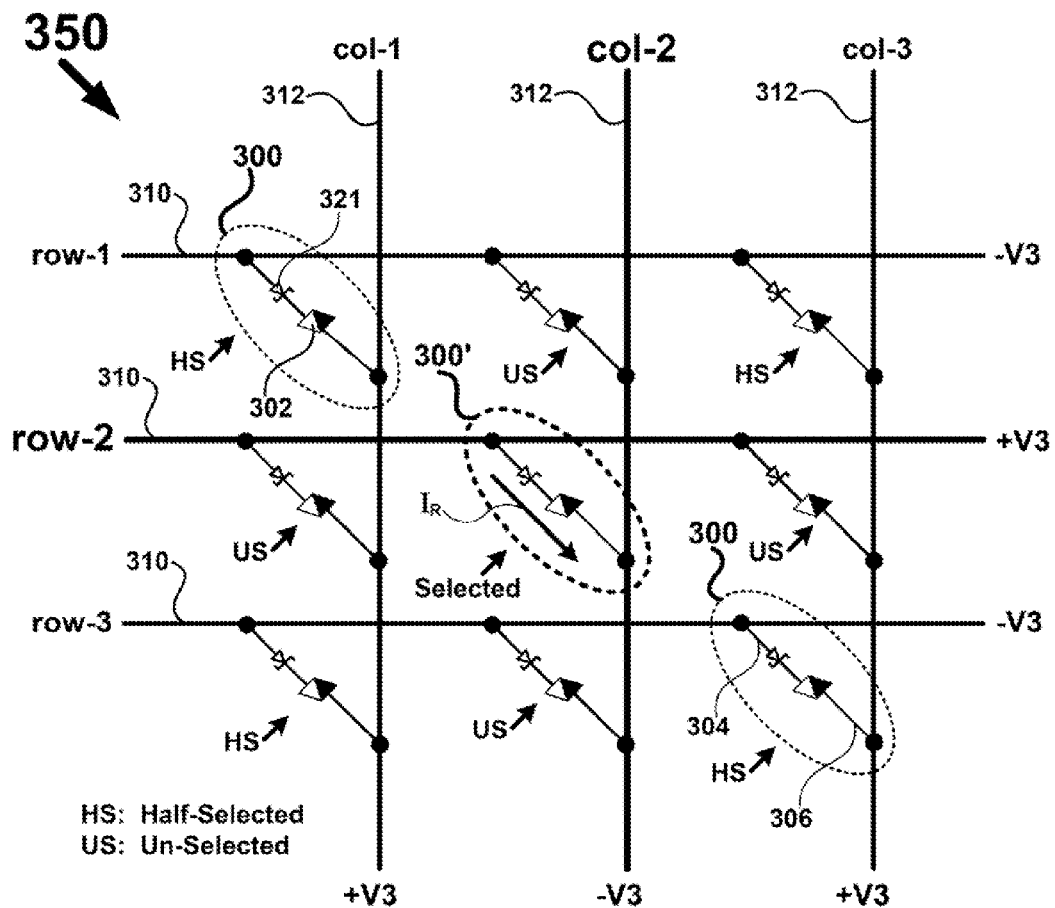
FIG. 3C depicts a schematic view of a memory array during a read operation to a memory cell including a single Schottky diode NOD isolation device according to the present invention.

Turning to FIG. 3C, a schematic depicts a read operation performed on a single selected memory cell 300' in the array 350. Here, all the unselected row conductors 310 have an applied voltage potential of −V3 and all un-selected column conductors 312 have an applied voltage potential of +V3, with the selected memory cell 300' having voltage potentials of +V3 and −V3 applied to its row 310 and column 312 conductors, respectively. A read table 390 depicts the potential difference across the terminals of the selected 300' and un-selected memory cells 300. Un-selected memory cells 300 have a potential difference of −2V3 or 0V; whereas, the selected memory cell 300' has a potential difference of +2V3. It should be noted that the magnitude of read voltages are typically less than the magnitude of voltages for program or erase operations because a lower magnitude of read voltage prevents data stored in the selected memory cell(s) 300' from being overwritten or corrupted during read operations. In FIG. 3C, for a read operation |V3|<|V1| and |V3|<|V2|. For example, in FIG. 3A, if +V1=+2V and −V1=−2V such that the potential difference across selected memory cell 300' during the programming operation is (+2V−(−2V))=+4V, then in FIG. 3C, if +V3=+1V and −V3=−1V such that the potential difference across selected memory cell 300' during the read operation is (+1V−(−1V))=+2V; therefore, |V3|<|V1| because |2V1|<|4V|. The application of the read voltage generates a read current $I_R$ that flows through the selected memory cell 300' and a magnitude of the read current $I_R$ is indicative of the value of stored data in the selected memory cell 300'. For example, if the programmed conductivity profile comprises a high resistance state (e.g., programmed conductivity is low) then the magnitude of the read current $I_R$ will be low when the memory cell 300' is in the programmed state. Conversely, if the erased conductivity profile comprises a low resistance state (e.g., erased conductivity is high) then the magnitude of the read current $I_R$ will be higher when the memory cell 300' is in the erased state.

Therefore, given the previous examples, $I_{R-Erased} > I_{R-Programmed}$. The actual conventions for the resistance or conductivity values for programmed and erased states will be application dependent and the foregoing is just one example of how the programmed and erased states can be defined. The read current $I_R$ signal along with one or more other signals (e.g., leakage currents and/or reference signals) can be electrically coupled with sense circuitry (e.g., FEOL active circuitry) that compares those signals in the current or voltage domains to generate a signal that is indicative of the valued of data stored in the selected memory cell(s) 300'.

Figure 4:
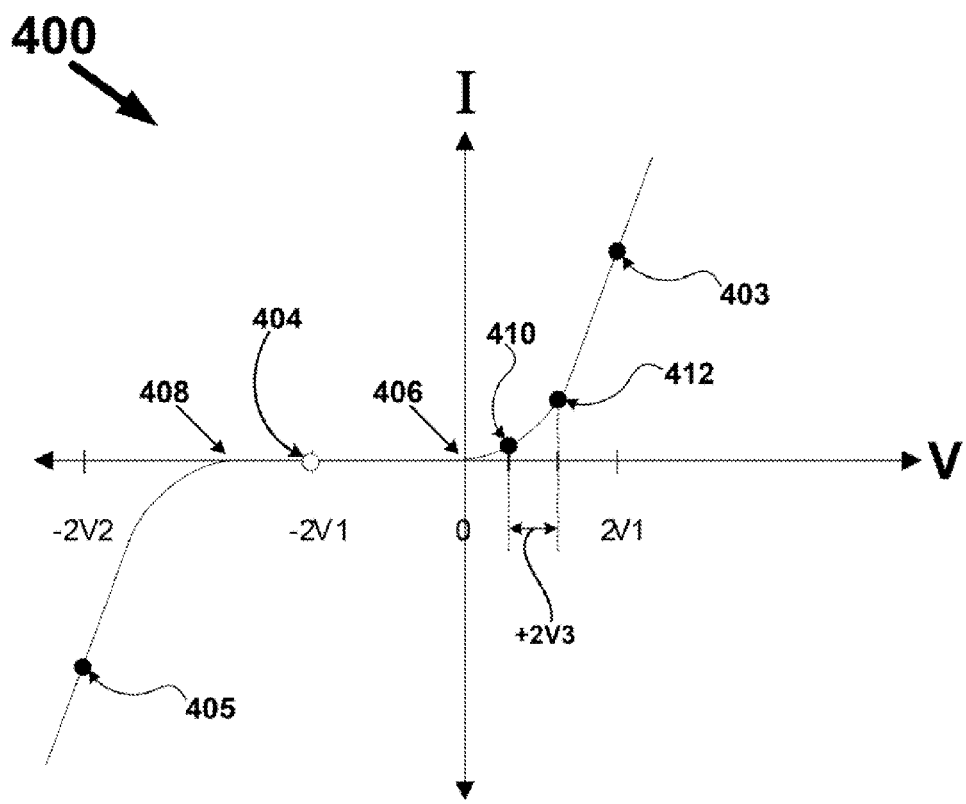
FIG. 4 depicts an I-V curve for a memory cell including a single Schottky diode NOD isolation device according to the present invention.

Attention is now directed to FIG. 4 where an I-V curve 400 depicts a non-linear relationship between current I on a y-axis and voltage V on an x-axis for a memory cell 300 that includes the Schottky diode NOD (321, 621). Operating points 403 and 405 for selected memory cells 300' depict current flow I through the selected memory cell(s) 300' at a potential difference along the x-axis of +2V1 at an operating point 403 and −2V2 at an operating point 405. On the other hand, an operating point 404 for un-selected memory cells 300 depicts very low current flow I for a potential difference along the x-axis of −2V1 such that a reverse current at −2V1 is orders of magnitude lower than a forward current at 2V1. Therefore, from about 0V on the x-axis at a point 406 to a point 408 located between voltages −2V2 and −2V1, the reverse current for 1 is substantially lower than the forward current for 1 from the point 410 to 403.

Accordingly, in FIG. 3A where un-selected memory cells 300 either have a potential difference across their terminals of 0V or −2V1, current I is very low (e.g., at operating point 404) during the program operation to selected memory cell 300'. In FIG. 3B, since all of the memory cells are selected memory cells 300' during the sector erase operation, all of the selected memory cells 300' have a current I at the operating point 405 at −2V2. In regard to the read operation depicted in FIG. 3C, operating points 410 and 412 can depict a range of read currents $I_R$ that flow when the read voltage +2V3 is applied across the terminals (304, 306) of the selected memory cell 300'. The lower value of the read current $I_R$ at operating point 410 can be indicative of the memory cell 300' storing data in the programmed state (e.g., higher resistance=lower current magnitude) and the higher value of the read currents $I_R$ at operating point 412 can be indicative of the memory cell 300' storing data in the erased state (e.g., lower resistance=higher current magnitude).

The Schottky diode (321, 621) may be readily integrated into a back-end process for fabricating BEOL memory layers. For example, amorphous silicon may be subjected to a rapid thermal annealing step (e.g., at a temperature of about 700° C.) that converts the amorphous silicon to a single layer of polycrystalline silicon (also called polysilicon or poly-Si). A lightly doped n-type polysilicon line atop a metal plug on the memory device will produce a Schottky diode. Resistivity of the polysilicon line may be reduced by siliciding (e.g., reacting with Ni or Co) the top surface of the polysilicon to form a silicide layer (e.g., nickel silicide or cobalt silicide). The Schottky diode (321, 621) should be easier to integrate than a p-n junction diode, in addition to having a better controlled reverse breakdown voltage. A silicon wafer including active circuitry (e.g., CMOS devices) fabricated thereon during a front-end-of-the-line process (FEOL) can include with the active circuitry, the circuits (drivers, decoders, sense amps, buffers, registers, etc.) that interface with the BEOL array 350 for data operations (e.g., read, program, and erase) to the memory cells 300. The BEOL array 350, its memory cells 300 (e.g., the two-terminal memory elements 302 and the Schottky diodes 321 or 621), and its conductive array lines (310, 312) can be fabricated directly on top of the silicon wafer and its active circuitry as part of a back-end-of-the-line process (BEOL). Using the BEOL process, one layer of cross-point memory array 350 or multiple layers of vertically stacked cross-point memory arrays 350 can be formed.

A single layer of polycrystalline silicon has advantages over using one or more layers of amorphous silicon (also referred to as α-Si or a-Si) to form a Schottky diode. Mainly, polycrystalline silicon has a mobility of charge carriers (e.g., in $cm^2/V \cdot s$) that can be orders of magnitude higher than that of amorphous silicon. For example, if a typical mobility of amorphous silicon is approximately less than 1 $cm^2/V \cdot s$, then a typical mobility of polycrystalline silicon can be approximately 10 $cm^2/V \cdot s$ or more. The higher mobility of charge carriers for polycrystalline silicon is desirable for supporting higher current flows through the memory cell 300 during data operations to the memory cells (see FIG. 4) such as read operations and write operations (e.g., program and erase operations). For read operations, a higher read current $I_R$ can reduce read errors in sense amp circuitry by increasing the signal to noise ratio (S/N) such that the signal representing the read current $I_R$ in the memory cell 300' being read is easy to distinguish over noise signals that may be present during read operations. Furthermore, the ability of polycrystalline silicon to support higher currents can be desirable during program and erase operations because the magnitude the voltage applied across the memory cell 300 during write operations is typically larger than the magnitude of the read voltage, resulting in larger magnitude currents I during write operations. Although one or more layers of amorphous silicon such as intrinsic α-Si and/or doped α-Si (e.g., doped n+) can be formed at lower processing temperatures than polycrystalline silicon, the higher processing temperatures required to form the singly layer of polycrystalline silicon are worthwhile given the larger currents that can be supported by the polycrystalline silicon.

As described above, each memory cell 300 can include two terminals (304, 306) electrically coupled with their respective pair of conductive array lines (310, 312) and the memory cell 300 can be positioned at a cross-point of its respective conductive array lines (310, 312). Each memory cell 300 can include electrically in series with its terminals and electrically in series with each other, the memory element 302 and the Schottky diodes (321, 621), such that the Schottky diode (321, 621) is integral with the memory cell 300.

Figure 5:
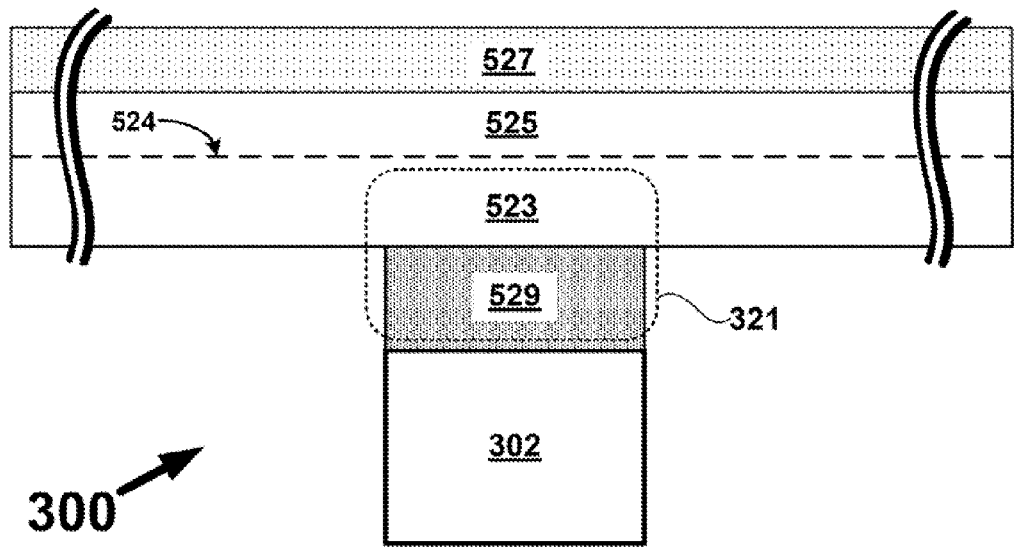
FIG. 5 depicts a cross-sectional view of a single Schottky diode NOD isolation device integrated with a memory element in a memory cell according to the present invention.

Referring now to FIG. 5, a cross-sectional view of a structure for a memory cell 300 that includes a memory element 302 and the single Schottky diode NOD 321 is depicted. After the memory element 302 is formed, a layer of metal 529 can be formed on top of the memory element 302 followed by a deposition of a single layer of lightly doped polycrystalline silicon (polysilicon) 523 on top of the layer of metal 529 to form the single Schottky diode NOD 321, and a silicide layer 527 formed on top of the polysilicon layer 523. The single layer of polysilicon 523 may initially be amorphous silicon that is annealed, heated, or otherwise transformed from an amorphous silicon structure to a polycrystalline silicon structure. It may be necessary to form an ohmic contact between the polysilicon layer 523 and the silicide layer 527. Accordingly, a portion 525 (e.g., the portion above dashed line 524) of the single layer of polysilicon 523 can be doped with a doping type that is opposite to the type of doping for the lightly doped layer 523. For example, the polysilicon layer 523 can be lightly doped n− and the portion 525 can be doped n+. Subsequently, a silicide layer 527 can be deposited on the portion 525 to form the ohmic contact between layers 523 and 527.

Figure 5A:
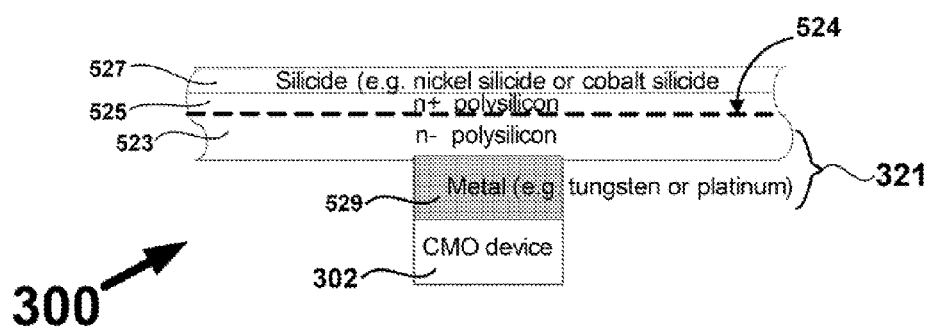
FIG. 5A depicts a cross-sectional view of one example of a single Schottky diode NOD isolation device integrated with a memory element in a memory cell according to the present invention.

FIG. 5A depicts a cross-sectional view of one example for a structure for the Schottky diode NOD 321 formed by contact between a layer of metal 529 and a single layer of n− polysilicon 523. The single layer of n− polysilicon 523 includes a second portion comprised of n+ polysilicon 525 which is in contact with a layer of a silicide material 527. The layer of metal 529 is positioned on top and in contact with the memory element 302. However, the arrangement depicted is just one example and the layers (523, 529) need not be in direct contact with the memory element 302 and the memory element 302 can be positioned above the layer of metal 529 and the other layers of material for the Schottky diode NOD 321. In that the memory element 302 and the NOD 321 are electrically in series with each other, their relative positions in the memory cell 300 can be determined by processing requirements and/or design requirements. Accordingly, the NOD 321 and memory element 302 need not be in contact with each other. For example, the layer 529 in FIGS. 5 and 5A need not be in direct physical contact with the memory element 302 and some other electrically conductive structure in the memory cell 300 (e.g., an electrically conductive glue or adhesion layer) can be positioned between the NOD 321 and the memory element 302. Current flow through the memory cell 300 can be accomplished by placing a potential difference of −0.5V across the terminals (304, 306) of the memory cell 300 (e.g., −0.5V on terminal 304 and 0V on terminal 306) or a potential difference of +4V across the terminals (e.g., +4V on terminal 304 and 0V on terminal 306).

Suitable materials for the layer of silicide 527 include but are not limited to a nickel Ni silicide and a cobalt Co silicide, for example. Suitable materials for the layer of metal 529 include but are not limited to tungsten (W), aluminum (Al), and platinum (Pt), for example. The metal layer 529 can be a structure such as a metal plug processed using a planarization technique such as CMP to form a substantially planar upper surface upon which to deposit the single layer 523. A single layer of amorphous silicon Si can be deposited on the metal layer 529 and surface doped (e.g., n−) using a low-energy implant or a $POCl_3$ reaction. The single layer 523 can be subjected to rapid thermal annealing to convert the amorphous Si into polycrystalline Si and to activate the dopant. Annealing temperatures will be application dependent; however, the annealing temperature can be about 700° C. or about 500° C. or lower if metal-assisted crystallization is used. Subsequently, the single layer 523 can be patterned and etched. Additional thin film layers required by the memory cell 300 can be deposited on the layer 523 or 527, such as a silicon nitride $SiN_3$ spacer layer, for example.

Figures 6A, 6B:
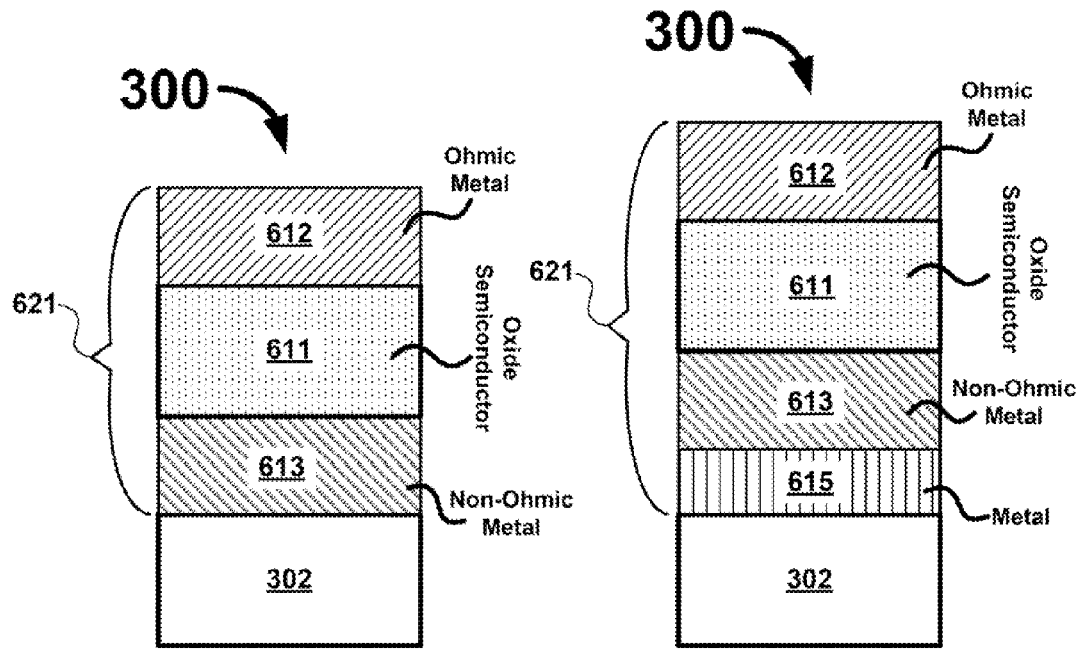
FIGS. 6A-6D depict a cross-sectional views of alternate embodiments of an oxide semiconductor based single Schottky diode NOD isolation device integrated with a memory element in a memory cell according to the present invention.
Figures 6C, 6D:
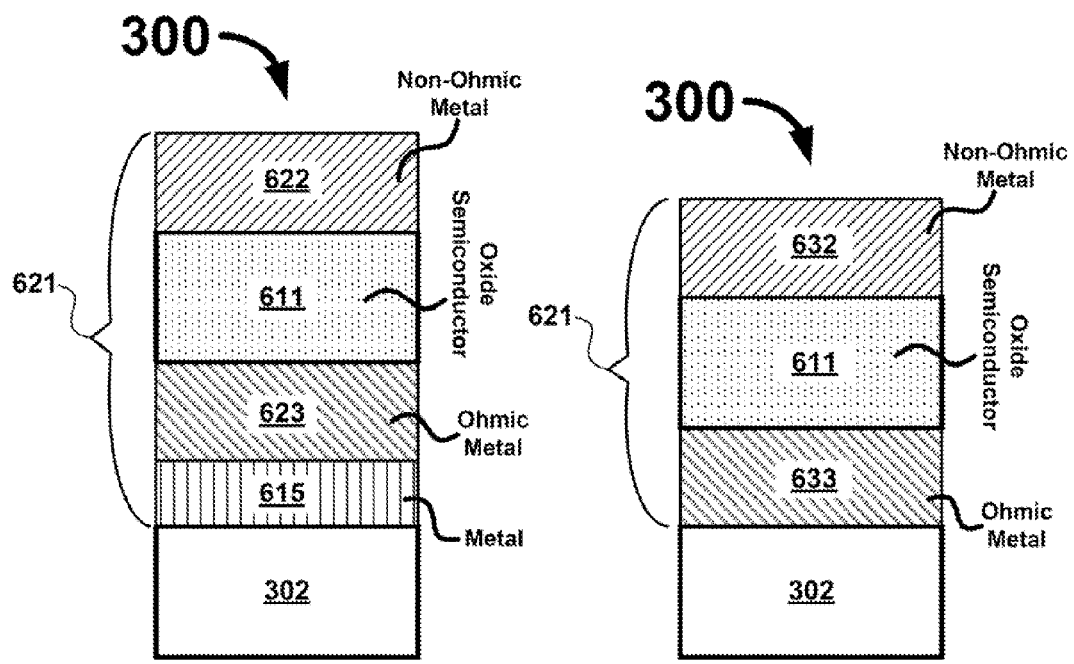

FIGS. 6A through 6D depict alternate examples for the single Schottky diode NOD 621 based on a single layer of an oxide semiconductor material 611. Although the NOD 621 and memory element 302 are depicted in contact with each other, as was described above, the NOD 621 and memory element 302 need not be in contact with each other. The Schottky diode NOD 621 is similar to the NOD 321 of FIGS. 5 and 5A, but the NOD 621 utilizes an oxide semiconductor in place of the lightly doped polysilicon 523 and can use different materials for the metal electrodes. In FIG. 6A and FIG. 6B the single layer of oxide semiconductor material 611 is sandwiched between and is in contact with non-ohmic metal 613 and ohmic-metal 612. In FIG. 6A the non-ohmic metal 613 is shared with the memory element 302. In FIG. 6B, the non-ohmic metal 613 is in contact with a metal layer 615 such that a metal/oxide semiconductor/metal structure is positioned on top of the memory element 302. In FIG. 6C and FIG. 6D the single layer of oxide semiconductor material 611 is in contact with and is sandwiched between and ohmic metal (623, 633) and non-ohmic metal (622, 632). In FIG. 6C, the ohmic metal 623 is in contact with a metal layer 615 such that a metal/oxide semiconductor/metal structure is positioned on top of the memory element 302. In FIG. 6D, the ohmic metal 633 is shared with the memory element 302. The memory element 302 may be positioned at the bottom of the stack for memory cell 300 as depicted or may be positioned at the top of the stack for the memory cell 300 (not shown).

Suitable materials for the oxide semiconductor 611 include but are not limited to perovskites and binary oxides. The perovskite can be a doped $SrTiO_3$ (e.g., doped with niobium Nb or lanthanum La), for example. The binary oxide can be nickel oxide $NiO_x$, zinc oxide $ZnO_x$, or tin oxide $SnO_x$, for example. Suitable non-ohmic metals include but are not limited to platinum Pt, palladium Pd, and iridium Ir. Suitable ohmic metals include but are not limited to magnesium Mg, indium In, aluminum Al, and tantalum Ta. Suitable materials for the metal 615 include but are not limited to platinum Pt, iridium Ir, and iridium oxide $IrO_x$. In some applications the ohmic metal may not be necessary if the oxide semiconductor 611 includes a graded doping profile with a very high doping profile at the ohmic interface, that is, the doping concentration is highest at the ohmic interface.

The NOD 621 can be fabricated using processing steps including but not limited to metal deposition, CMP to produce metal plugs, oxide semiconductor 611 deposition, graded-doping of the oxide semiconductor 611 during deposition or post deposition using implantation, patterning and etching the oxide semiconductor 611, annealing for contact improvement, and deposition of additional layers of material, such as glue layers, for example.

The memory element 302 can be comprised of discrete layers of material (e.g., etched layers in the stack for memory cell 300) or can be continuous and un-etched layers of material that include one or more layers of a conductive metal oxide (CMO) that are in contact with each other and are continuous and un-etched layers and a continuous and un-etched electronically insulating layer (e.g., yttria-stabilized zirconia—YSZ) in contact with an uppermost of the CMO layers. Portions of the one or more layers of CMO that are positioned in the stack for memory cell 300 can be electrically conductive and portions outside of the stack can be made electrically nonconductive insulating metal oxides (IMO's) by treating those portions to transform them from conductive to insulating (e.g., by ion implantation). If ion implantation is used to transform portions of the CMO to an IMO, portions of the memory stack (e.g., an electrode, a hard mask layer, or the NOD 321 or 621) can be used as an implantation mask operative to shield the portion of the CMO layer that is to remain electrically conductive from the ions during implantation such that the portions of the CMO layer positioned outside the memory stack are bombarded by the ions and are transformed into IMO's.

Figure 7A:
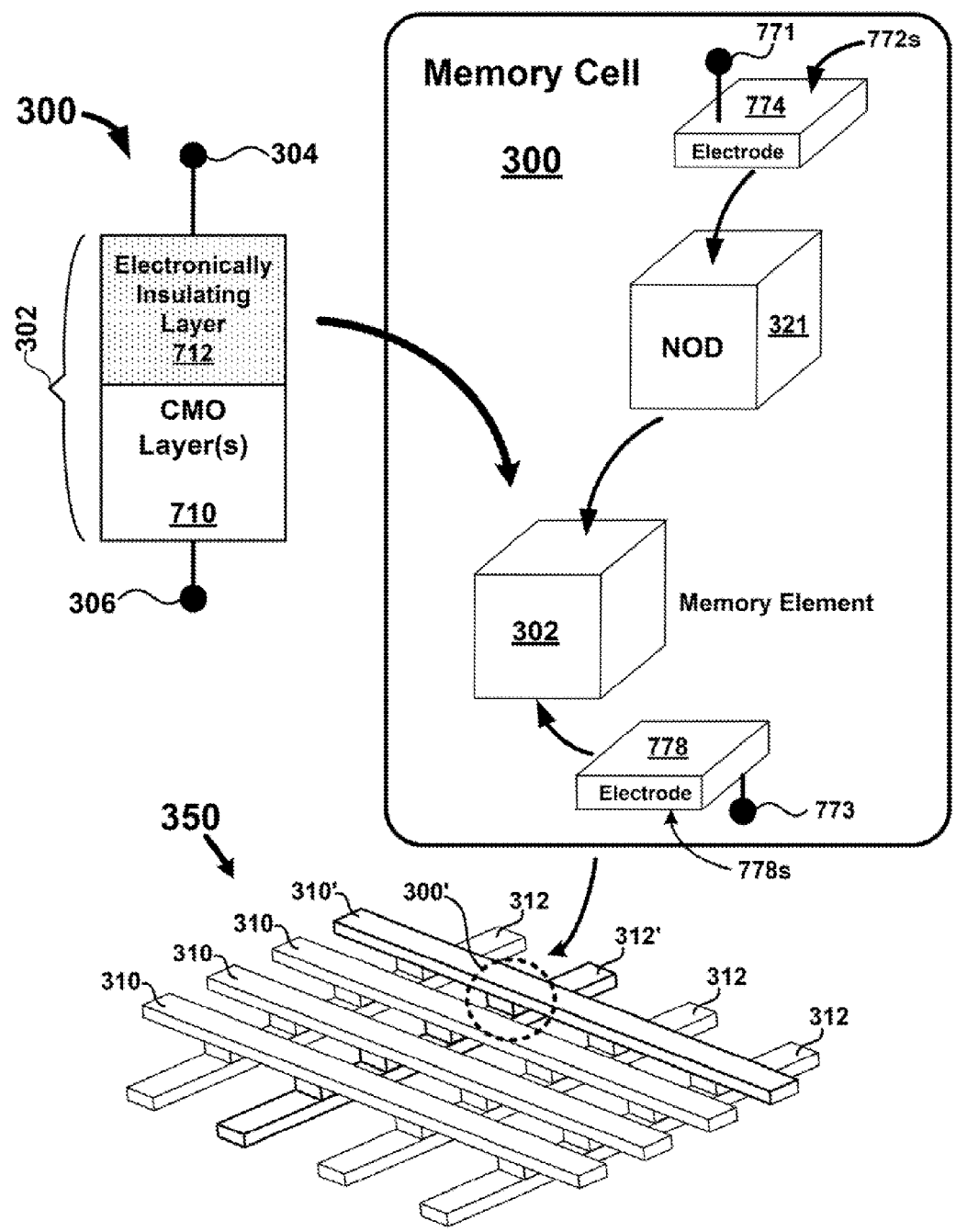
FIG. 7A depicts an example of memory cells positioned in a two-terminal cross-point array according to various embodiments of the invention.

FIG. 7A depicts an example of arrayed memory cells according to various embodiments of the invention. In this example, a memory cell 300 includes a memory element 302 and NOD 321 positioned above or below (not shown) the memory element 302. The memory element 302 can include the above mentioned CMO layer(s) and electronically insulating layer denoted as 710 and 712 respectively. The layers 710 and 712 can be discrete layers as depicted or they can be continuous and un-etched layers (not shown) as described above. Memory cell 300 further includes terminals 771 and 773. Terminals 771 and 773 can be electrically coupled with or can be formed as electrodes 774 and 778. The electrodes (774, 778) can be made from an electrically conductive material including, but not limited to, platinum (Pt), gold (Au), silver (Ag), iridium (Ir), iridium oxide ($IrO_x$), ruthenium (Ru), palladium (Pd), aluminum (Al), alloys of those materials, and the like. The electrodes (774, 778) can be in contact with and/or electrically coupled with conductive array lines operative to apply the aforementioned voltages for data operations, such as read voltages and write voltages (e.g., program and erase voltages) across one or more selected memory cells 300. The memory element 302 and NOD 321 are electrically in series with each other and electrically in series with the electrodes (774, 778).

Memory cell 300 can be formed between conductive array lines, such as array lines 312 and 310. Thus, memory cell 300 can be formed in an array of other memory cells 300. In FIG. 7A, array lines 312' and 310' are depicted in heavy line to illustrate that those array lines have voltages for data operations applied to them such that memory cell 300' is the selected memory cell for the data operation. The array can be the cross-point array 350 including groups of conductive array lines 310 and 312. For example, array lines 310 can be electrically coupled with the electrodes 774 of the memory cells 300 and/or may be in contact with a surface 772s of the electrodes 774, and array lines 312 can be electrically coupled with the electrodes 778 of the memory cells 300 and/or may be in contact with a surface 778s of the electrodes 778. Although not depicted in FIG. 7A, the active circuitry that applies the voltages for data operations is positioned below the array 350 on a substrate with the array 350 fabricated directly on top of the substrate and the array 350 in contact with the substrate.

Figure 7B:
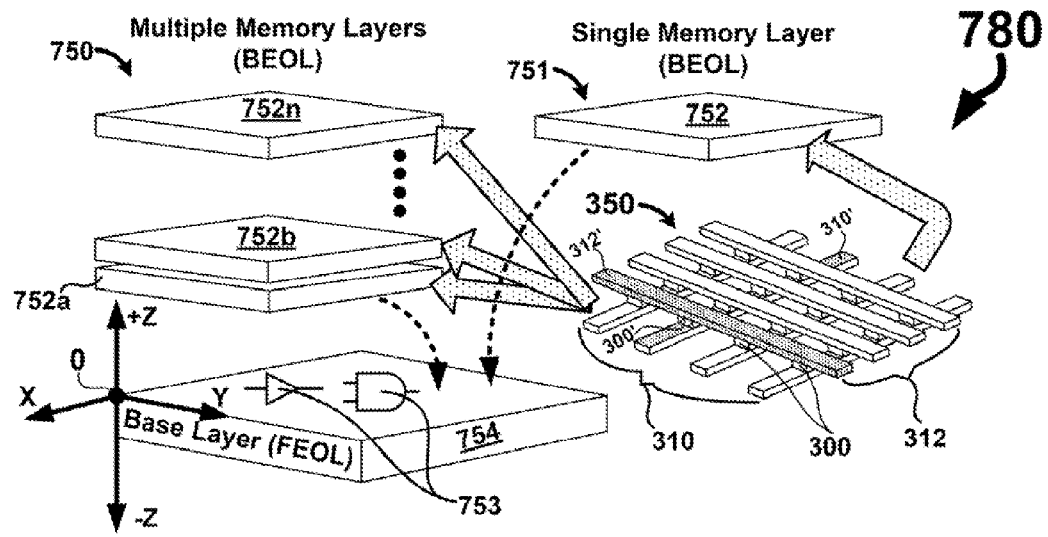
FIG. 7B depicts a single layer or multiple vertically stacked layers of memory arrays formed BEOL on top of a base layer including circuitry formed FEOL.

FIG. 7B depicts an integrated circuit including memory cells disposed in a single layer or in multiple layers of memory, according to various embodiments of the invention. In this example, integrated circuit 780 is shown to include either multiple layers 750 of memory (e.g., layers 752a, 752b, . . . 752n) or a single memory layer 751 (e.g., layer 752) formed on a base layer 754. As will be described in greater detail below, the layers 754 and 752a, 752b, . . . 752n or layers 754 and 752 are not physically separate layers as depicted in FIG. 7B for purposes of illustration, rather they are different portions of a unitary die 800 (not shown) comprised of a FEOL portion for the base layer 754 and a BEOL portion for the layer 752 or layers 752a, 752b, . . . 752n. In at least some embodiments, each layer (e.g., layer 752 or layers 752a, 752b, . . . 752n) of memory can be a cross-point memory array 350 including conductive array lines 310 and 312 arranged in different directions to access re-writable memory cells 300 such as two-terminal memory cells as described above. Examples of conductive array lines include X-line conductive array lines (e.g., 310) and Y-line conductive array lines (e.g., 312). The X and Y conductive array lines are sometimes referred to as row lines and column lines respectively. Base layer 754 can include a bulk semiconductor substrate (e.g., a silicon wafer) upon which memory access circuits 753 for performing data operations on the memory cells 300 in memory 750 or 751 are fabricated. Base layer 754 may include other circuitry that may or may not be related to data operations on memory. Base layer 754 and circuitry 753 (e.g., CMOS active circuitry such as decoders, drivers, sense amps, buffer, registers, etc.) can be formed in a front-end-of-the-line (FEOL) fabrication process and multiple memory layers 750 or single memory layer 751 can be formed in a back-end-of-the-line (BEOL) fabrication process tailored to fabricating layer(s) of memory arrays on top of the base layer 754. Although not depicted, the base layer 754 can include an inter-level interconnect structure configured to include nodes (e.g., openings in a dielectric material or electrically conductive structures such as vias, plugs, thrus, damascene structures, etc.) for facilitating electrical coupling between the circuitry 753 and the conductive array lines (310, 312) of the array(s) so that signals (e.g., read and write voltages) for data operations (e.g., read and write operations) are electrically communicated between the array(s) and the circuitry 753. The inter-level interconnect structure can be one of the last microelectronic structures fabricated during the FEOL processing.

Figure 7C:
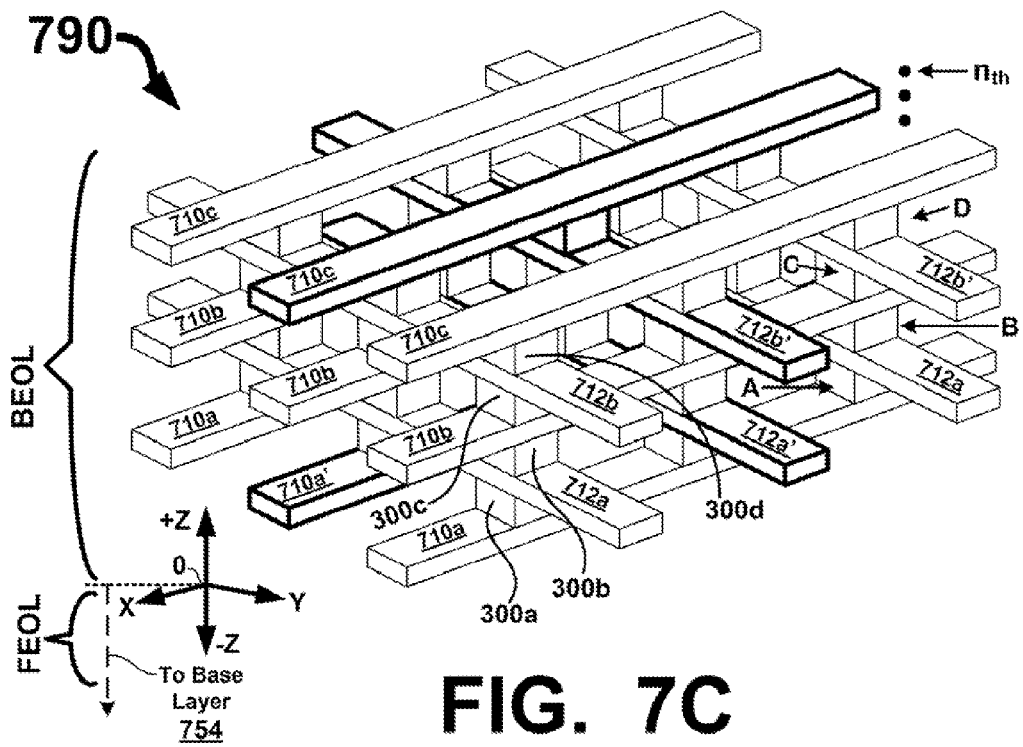
FIG. 7C depicts one example of a vertically stacked memory including multiple array layers that share conductive array lines and formed BEOL on top of a previously formed FEOL base layer.

Moving on to FIG. 7C, where a vertically stacked array 790 includes a plurality of memory layers A, B, C, and D with each memory layer including memory cells 300a, 300b, 300c, and 300d. Although only four layers are depicted, the array 790 can include fewer layers or can include additional layers up to an nth layer. The array 790 includes three levels of x-direction conductive array lines 710a, 710b, and 710c, and two levels of y-direction conductive array lines 712a, and 712b. Unlike the configuration for array 350 in FIG. 7A, the memory cells 300a, 300b, 300c, and 300d depicted in FIG. 7C share conductive array lines with other memory cells that are positioned above, below, or both above and below that memory cell. The conductive array lines, the memory cells, dielectric materials that electrically isolate structures in the array 790 (not shown), and other structures in the array 790 are formed BEOL above the base layer 754 (not shown) as indicated by +Z on the Z-axis above the dashed line at origin 0; whereas, the active circuitry for performing data operations on the array 790 and the interconnect structure for electrically coupling the active circuitry with the array 790 (e.g., the conductive array lines) are previously formed FEOL as indicated by −Z on the Z-axis below the dashed line at origin 0. Accordingly, the BEOL structure for array 790 is formed on top of the FEOL structure for base layer 754 with the order of fabrication going in a direction from −Z (i.e., FEOL) to +Z (i.e., BEOL) along the Z-axis.

Figure 8A:
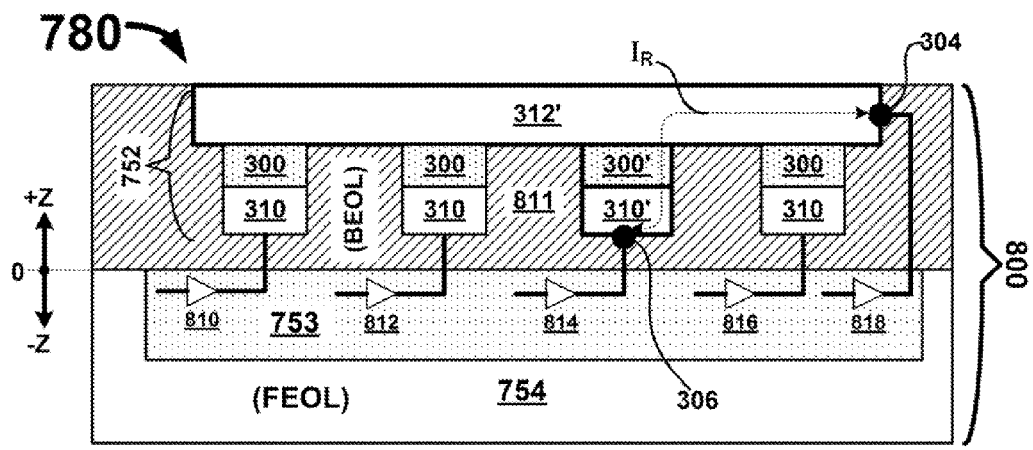
FIG. 8A depicts a cross-sectional view of an integrated circuit die including a single layer of memory fabricated over a substrate including active circuitry fabricated in a logic layer.

Reference is now made to FIG. 8A, where integrated circuit 780 includes the base layer 754 and active circuitry 753 fabricated on the base layer 754 (e.g., a silicon Si wafer). The integrated circuit 780 is comprised of a single unitary die 800 having a first portion (i.e., the base layer 754) fabricated first using FEOL processing and a second portion (i.e., the single memory layer 752) fabricated second and formed directly on top of the base layer 754 using BEOL processing, such that the second portion is integrally formed with the first portion and completes the formation of the die 800. As one example, the base layer 754 can be a silicon (Si) wafer and the active circuitry 753 can be microelectronic devices formed on the base layer 754 using a CMOS fabrication process. The memory cells 300 and their respective conductive array lines (310, 312) can be fabricated on top of the active circuitry 754 in the base layer 754. Those skilled in the art will appreciate that an inter-level interconnect structure (not shown) can electrically couple the conductive array lines (310, 312) with the active circuitry 753 which may include several metal layers. For example, vias can be used to electrically couple the conductive array lines (310, 312) with the active circuitry 753. The active circuitry 753 may include but is not limited to address decoders, sense amps, memory controllers, data buffers, direct memory access (DMA) circuits, voltage sources for generating the read and write voltages, just to name a few. Active circuits 810-818 can be configured to apply the select voltage potentials (e.g., read and write voltage potentials) to selected conductive array lines (310', 312'). Moreover, the active circuitry 753 may be electrically coupled with the conductive array lines (310', 312') to sense a read current $I_R$ that flows through selected memory cells 300' during a read operation and the read current $I_R$ can be sensed and processed by the active circuitry 753 to determine the conductivity profiles (e.g., the resistive state) of the selected memory cells 300'. Examples of conductivity profiles include but are not limited to a programmed conductivity profile written to a memory cell 300' during a programming data operation and an erased conductivity profile written to a memory cell 300' during an erase data operation. Memory cells 300 can store data as a plurality of conductivity profiles that can include the programmed or erased conductivity profiles only (e.g., only 1-Bit of data stored per memory cell 300) or more than two conductivity profiles for storing multiple bits of data per memory cell 300 (e.g., two or more bits of data per memory cell 300). The direction of current flow for the read current $I_R$ will depend on a magnitude and polarity of a read voltage applied across terminals 304 and 306. In some applications, it may be desirable to prevent un-selected array lines (310, 312) from floating. The active circuits 753 can be configured to apply an un-select voltage potential (e.g., approximately a ground potential) to the un-selected array lines (310, 312). A dielectric material 811 (e.g., $SiO_2$) may be used where necessary to provide electrical insulation between elements of the integrated circuit 780.

Figure 8B:
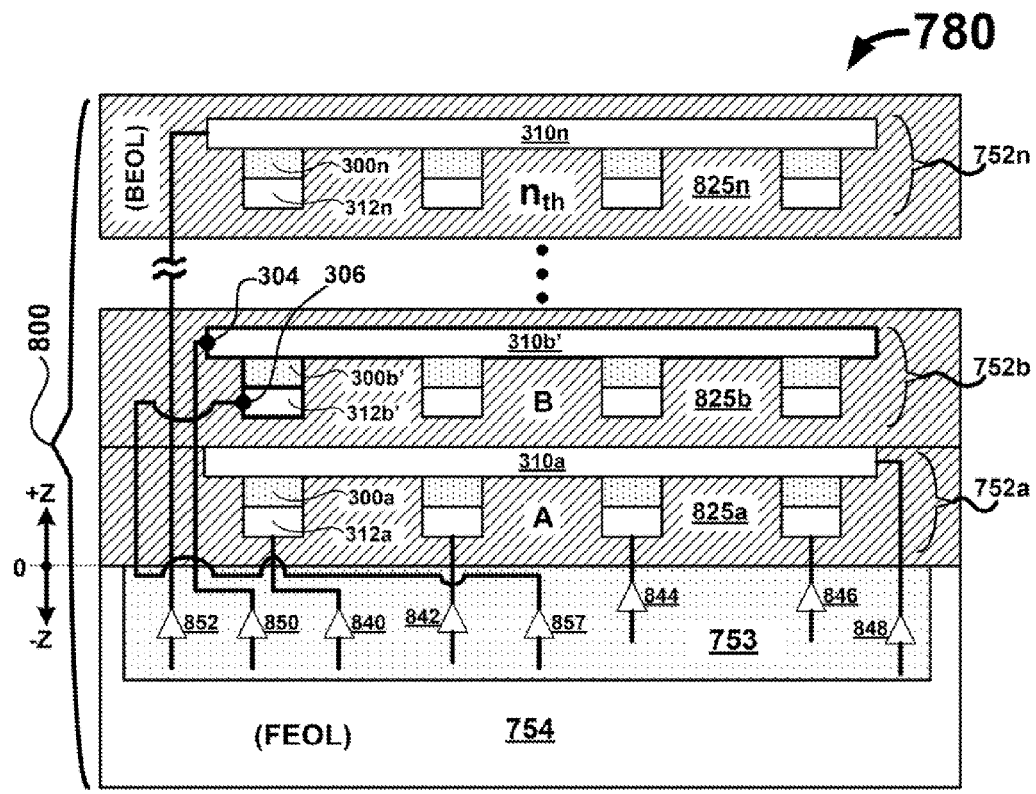
FIG. 8B depicts a cross-sectional view of an integrated circuit die including vertically stacked layers of memory fabricated over a substrate including active circuitry fabricated in a logic layer.

Moving now to FIG. 8B, an integrated circuit 780 includes a plurality of non-volatile memory arrays that are vertically stacked above one another (e.g., along a +Z axis) and are positioned above the base layer 754 that includes the active circuitry 753. The integrated circuit 780 includes vertically stacked memory layers A and B and may include additional memory layers up to an nth memory layer. The memory layers A, B, . . . through the nth layer can be electrically coupled with the active circuitry 753 in the base layer 754 by an inter-level interconnect structure as was described above. Layer A includes memory cells 300a and first and second conductive array lines (310a, 312a), Layer B includes memory cells 300b and first and second conductive array lines (310b, 312b), and if the nth layer is implemented, then the nth layer includes memory cells 300n and first and second conductive array lines (310n, 312n). Dielectric materials 825a, 825b, and 825n (e.g., $SiO_2$) may be used where necessary to provide electrical insulation between elements of the integrated circuit 820. Active circuits 840-857 can be configured to apply the select voltage potentials (e.g., read and write voltage potentials) to selected conductive array lines (e.g., 310a, b, . . . n, and 312a, b, . . . n). Driver circuits 850 and 857 are activated to select conductive array lines 310' and 312' to select memory cell 300b' for a data operation. As was described above, the active circuits 753 can be used to sense the read current $I_R$ (not shown) from selected memory cells 300b' during a read operation and can be configured to apply the un-select voltage potential to the un-selected array lines. As described above, the integrated circuit 780 comprises the die 800 that is a unitary whole comprised of a FEOL circuitry portion fabricated on base layer 754 and a BEOL memory portion having multiple memory layers that is in contact with the FEOL portion and is fabricated directly on top of the FEOL portion.

Figure 8C:
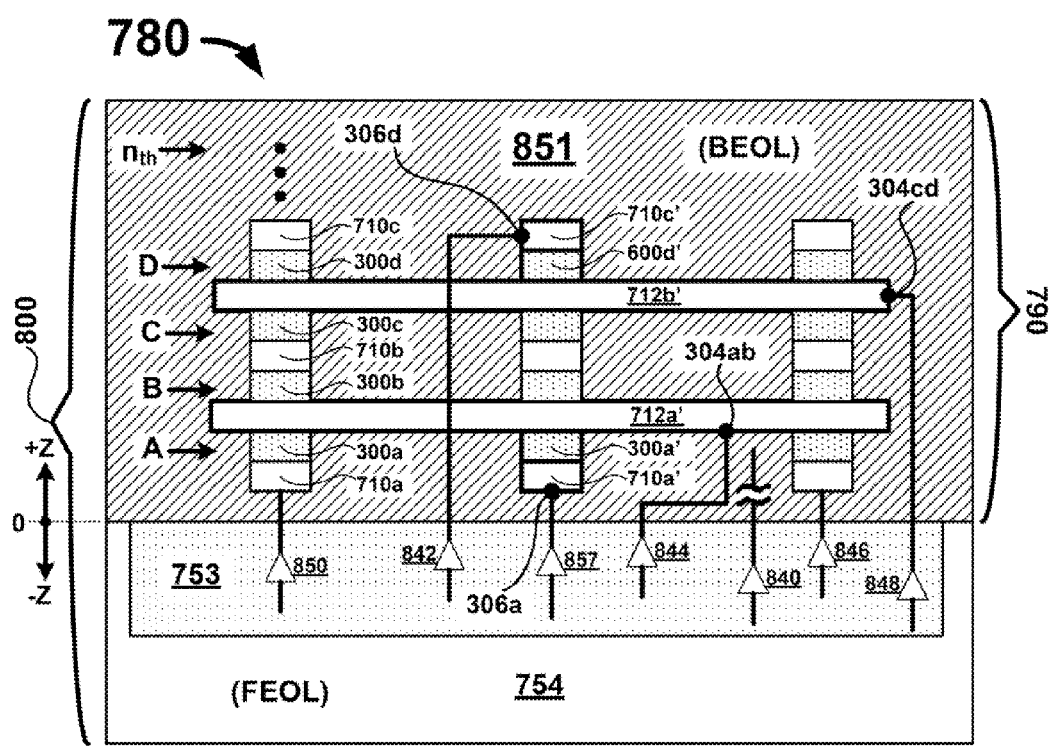
FIG. 8C depicts an integrated circuit die including vertically stacked layers of memory with shared conductive array lines fabricated over a substrate including active circuitry fabricated in a logic layer.

In FIG. 8C, an integrated circuit 780 includes base layer 754, active circuitry 753, and vertically staked memory layers A, B, C, and D that are fabricated above the base layer 754. Active circuits 840-857 are configured to perform data operations on the vertically staked memory layers A, B, C, and D. Driver circuits 844 and 857 are activated to select memory cell 300a' for a data operation and driver circuits 842 and 848 are activated to select memory cell 600d' for a data operation. A dielectric layer 851 is operative to electrically isolate the various components of integrated circuit 780. As described above, the integrated circuit 780 comprises the die 800 that is a unitary whole comprised of a FEOL circuitry portion fabricated on base layer 754 and a BEOL memory portion having multiple memory layers that is in contact with the FEOL portion and is fabricated directly on top of the FEOL portion.

Figure 9:
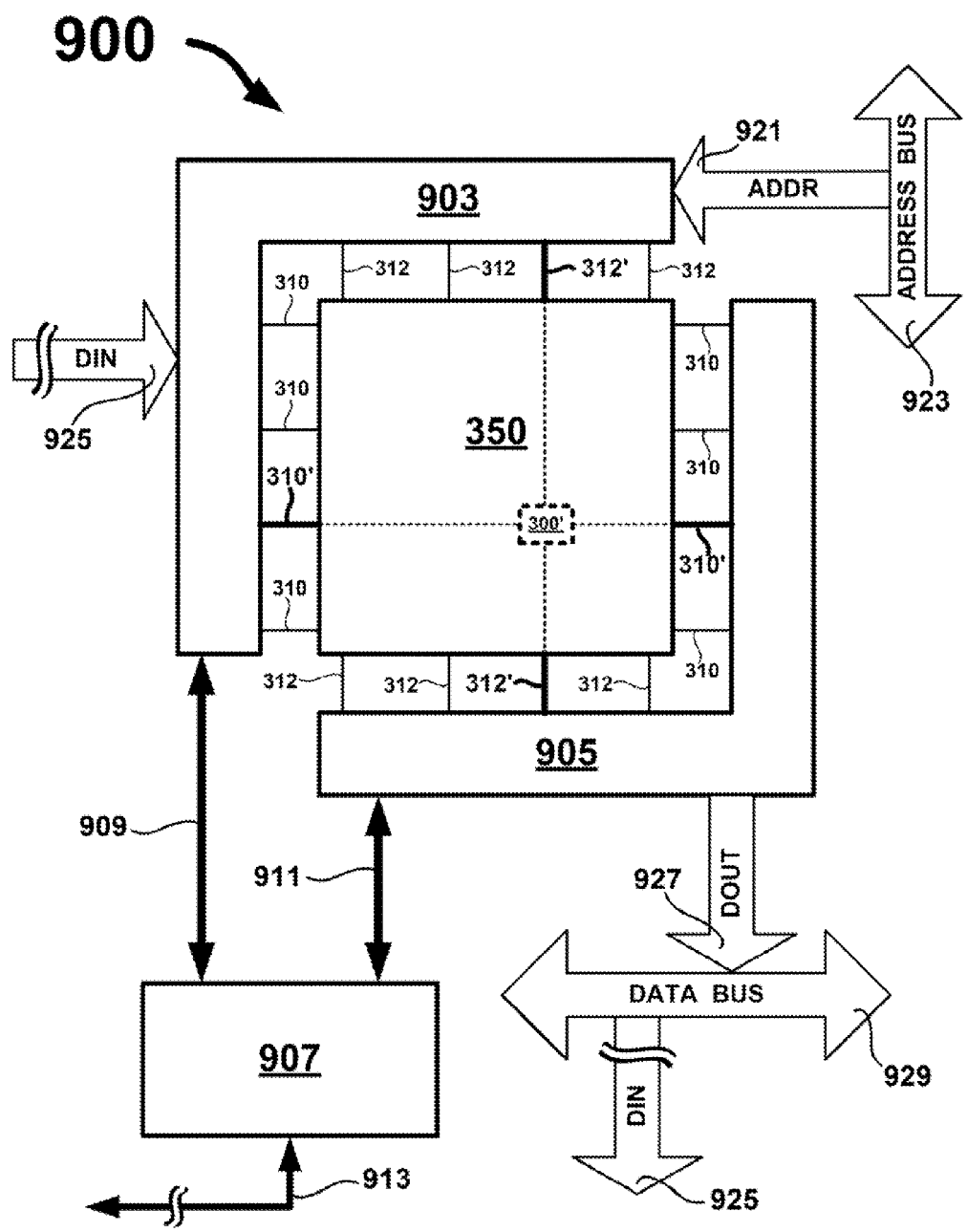
FIG. 9 depicts a memory system including a non-volatile two-terminal cross-point array.

Moving on to FIG. 9, an exemplary memory system 900 includes the aforementioned non-volatile two-terminal cross-point memory array 350 (array 350 hereinafter) and the plurality of first conductive and second conductive traces denoted as 310 and 312, respectively. The memory system 900 also includes an address unit 903 and a sense unit 905. The address unit 903 receives an address ADDR, decodes the address, and based on the address, selects at least one of the plurality of first conductive traces (denoted as 310') and one of the plurality of second conductive traces (denoted as 312'). The address unit 903 applies select voltage potentials (e.g., read or write voltages) to the selected first and second conductive traces 310' and 312'. The address unit 903 also applies a non-select voltage potential to unselected traces 310 and 312. The sense unit 905 senses one or more currents flowing through one or more of the conductive traces. During a read operation to the array 350, current sensed by the sense unit 905 is indicative of stored data in a memory cell 300' positioned at an intersection of the selected first and second conductive traces 310' and 312'. A bus 921 coupled with an address bus 923 can be used to communicate the address ADDR to the address unit 903. The sense unit 905 processes the one or more currents and at least one additional signal to generate a data signal DOUT that is indicative of the stored data in the memory cell. In some embodiments, the sense unit 905 may sense current flowing through a plurality of memory cells and processes those currents along with additional signals to generate a data signal DOUT for each of the plurality of memory cells. A bus 927 communicates the data signal DOUT to a data bus 929. During a write operation to the array 350, the address unit 903 receives write data DIN to be written to a memory cell specified by the address ADDR. A bus 925 communicates the write data DIN from the data bus 929 to the address unit 903. The address unit 903 determines a magnitude and polarity of the select voltage potentials to be applied to the selected first and second conductive traces 310' and 312' based on the value of the write data DIN. For example, one magnitude and polarity can be used to write a logic "0" and a second magnitude and polarity can be used to write a logic "1". In other embodiments, the memory system 900 can include dedicated circuitry that is separate from the address unit 903 to generate the select potentials and to determine the magnitude and polarity of the select potentials.

One skilled in the art will appreciate that the memory system 900 and its components (e.g., 903 and 905) can be electrically coupled with and controlled by an external system or device (e.g., a microprocessor or a memory controller). Optionally, the memory system 900 can include at least one control unit 907 operative to coordinate and control operation of the address and sense units 903 and 905 and any other circuitry necessary for data operations (e.g., read and write operations) to the array 350. Although only one array 350 is depicted, the array 350 can comprise a single layer of memory (e.g., 752) or multiple layers of vertically stacked memory (752a, 752b, ... 752n) as depicted in FIGS. 7A-8C. One or more signal lines 909 and 911 can electrically couple the control unit 907 with the address and sense units 903 and 905. The control unit 907 can be electrically coupled with an external system (e.g., a microprocessor or a memory controller) through one or more signal lines 913.

As was described above in reference to FIGS. 7A through 8C, one or more of the arrays 350 can be positioned over a substrate 754 that includes active circuitry 753 and the active circuitry 753 can be electrically coupled with the array(s) 350 using an interconnect structure that couples signals from the active circuitry 753 with the conductive array lines 310 and 312. In FIG. 9, the busses, signal lines, control signals, the address, sense, and control units 903, 905, and 907 can comprise the active circuitry 753 and its related interconnect, and can be fabricated on the substrate 754 (e.g., a silicon wafer) using a microelectronics fabrication technology, such as CMOS, for example.

Figure 10:
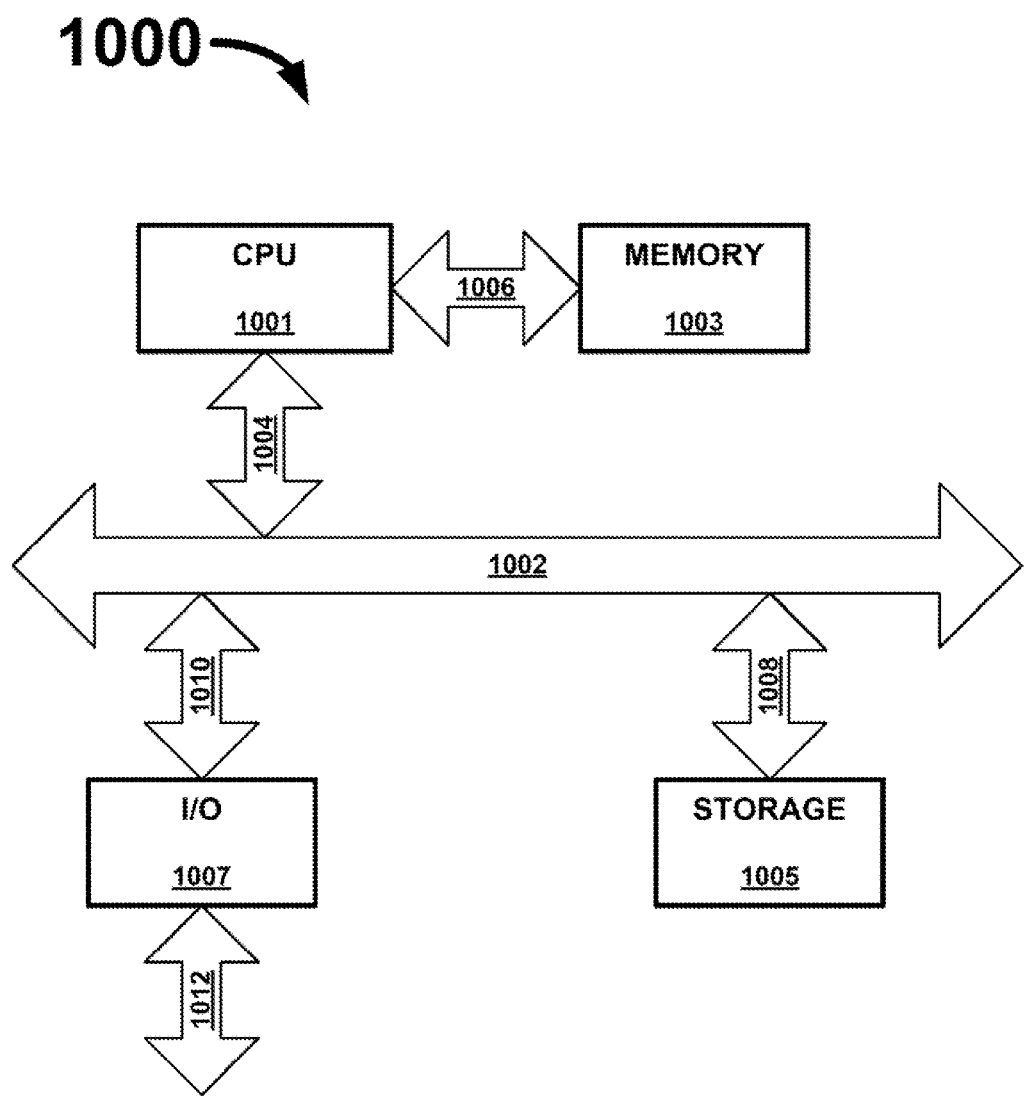
FIG. 10 depicts an exemplary electrical system that includes at least one non-volatile two-terminal cross-point array.

Reference is now made to FIG. 10, where an electrical system 1000 includes a CPU 1001 that is electrically coupled 1004 with a bus 1002, an I/O unit 1007 that is electrically coupled 1010 with the bus 1002, and a storage unit 1005 that is electrically coupled 1008 with the bus 1002. The I/O unit 1007 is electrically coupled 1012 to external sources (not shown) of input data and output data. The CPU 1001 can be any type of processing unit including but not limited to a microprocessor (μP), a micro-controller (μC), and a digital signal processor (DSP), for example. Via the bus 1002, the CPU 1001, and optionally the I/O unit 1007, performs data operations (e.g., reading and writing data) on the storage unit 1005. The storage unit 1005 stores at least a portion of the data in the aforementioned non-volatile two-terminal cross-point array as depicted in FIGS. 5 through 8C. Each memory array includes a plurality of the two-terminal memory cells 300. The configuration of the storage unit 1005 will be application specific. Example configurations include but are not limited to one or more single layer non-volatile two-terminal cross-point arrays (e.g., 752) and one or more vertically stacked non-volatile two-terminal cross-point arrays (e.g., 752a-752n). In the electrical system 1000, data stored in the storage unit 1005 is retained in the absence of electrical power. The CPU 1001 may include a memory controller (not shown) for controlling data operations to the storage unit 1005.

Alternatively, the electrical system 1000 may include the CPU 1001 and the I/O unit 1007 coupled with the bus 1002, and a memory unit 1003 that is directly coupled 1006 with the CPU 1001. The memory unit 1003 is configured to serve some or all of the memory needs of the CPU 1001. The CPU 1001, and optionally the I/O unit 1007, executes data operations (e.g., reading and writing data) to the non-volatile memory unit 1003. The memory unit 1003 stores at least a portion of the data in the aforementioned non-volatile two-terminal cross-point array as depicted in FIGS. 7A through 8C. Each memory array can include a plurality of the two-terminal memory cells 300 with each memory cell 300 including the two-terminal memory element 302 and the Schottky diode NOD (321, 621). The configuration of the memory unit 1003 will be application specific. Example configurations include but are not limited to one or more single layer non-volatile two-terminal cross-point arrays (e.g., 752) and one or more vertically stacked non-volatile two-terminal cross-point arrays (e.g., 752a-752n). In the electrical system 1000, data stored in the memory unit 1003 is retained in the absence of electrical power. Data and program instructions for use by the CPU 1001 may be stored in the memory unit 1003. The CPU 1001 may include a memory controller (not shown) for controlling data operations to the non-volatile memory unit 1003. The memory controller may be configured for direct memory access (DMA).

Figure 11:
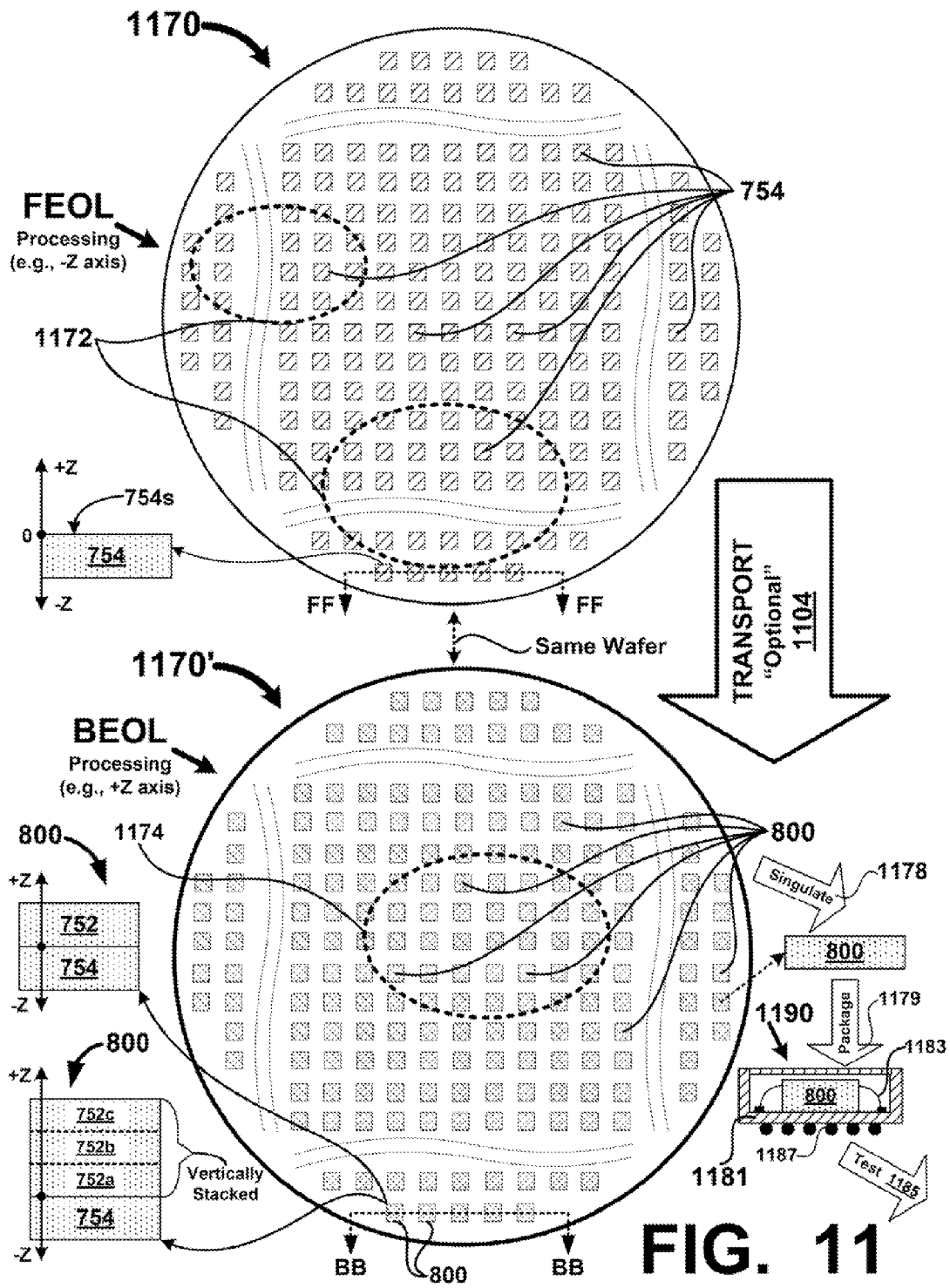
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packed into integrated circuits.

Reference is now made to FIG. 11, where a top plan view depicts a single wafer (denoted as 1170 and 1170') at two different stages of fabrication: FEOL processing on the wafer denoted as 1170 during the FEOL stage of processing where active circuitry 753 is formed; followed by BEOL processing on the same wafer denoted as 1170' during the BEOL stage of processing where one or more layers of non-volatile memory are formed. Wafer 1170 includes a plurality of the base layer die 754 (see FIGS. 7B-8C) formed individually on wafer 1170 as part of the FEOL process. As part of the FEOL processing, the base layer die 754 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 752 or multiple layers 752a, 752b, . . . 752n) directly on top of each base layer die 754. A base layer die 754 is depicted in cross-sectional view along a dashed line FF-FF where the substrate the die 754 is fabricated on (e.g., a silicon Si wafer) and its associated active circuitry are positioned along the −Z axis. For example, the one or more layers of memory are grown directly on top of an upper surface 754s of each base layer die 754 as part of the subsequent BEOL processing.

During BEOL processing the wafer 1170 is denoted as wafer 1170', which is the same wafer subjected to additional processing to fabricate the memory layer(s) directly on top of the base layer die 754. Base layer die 754 that failed testing may be identified either visually (e.g., by marking) or electronically (e.g., in a file, database, email, etc.) and communicated to the BEOL fabricator and/or fabrication facility. Similarly, performance graded base layer die 754 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 754 to form a finished die 800 that includes the FEOL circuitry portion 754 along the −Z axis and the BEOL memory portion along the +Z axis (see FIGS. 7B-8C). A cross-sectional view along a dashed line BB-BB depicts a memory device die 800 with a single layer of memory 752 grown directly on top of base die 754 along the +Z axis, and alternatively, another memory device die 800 with three vertically stacked layers of memory 752a, 752b, and 752c grown directly on top of base die 754 along the +Z. Finished die 800 on wafer 1170' may be tested 1174 and good and/or bad die identified. Subsequently, the wafer 1170' can be singulated 1178 to remove die 800 (e.g., die 800 are precision cut or sawed from wafer 1170') to form individual memory device die 800. The singulated die 800 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 800 mounted in the package 1181 and electrically coupled 1183 with the interconnect structure 1187 (e.g., using wire bonding). The integrated circuits 1190 may undergo additional testing 1185 to ensure functionality and yield.

In general, the devices and methods discussed herein are applicable to semiconductor memory (i.e., material used for data storage) formed and fabricated using various types of materials such as silicon dioxide, silicon oxide, noble metals, conductive metal oxides (e.g., perovskites), and others. Examples of such memories include SRAM, MRAM and FLASH memories, cross-point array (layout) memory and stacked cross-point array memory (e.g., whether single layer non-volatile two-terminal cross-point arrays, or one or more vertically stacked non-volatile two terminal cross arrays), three/third-dimension memory arrays (including those that emulate other types of memory, providing memory combinations within a single component), resistive state memory devices, and memory systems.

The foregoing examples have been described in some detail for purposes of clarity of understanding, but are not limited to the details provided. There are many alternative ways and techniques for implementation. The disclosed examples are illustrative and not restrictive.

What is claimed is:

1. A memory device, comprising:
   a first terminal;
   a second terminal;
   a re-writeable non-volatile two-terminal memory element (ME) including
      a binary conductive oxide layer including mobile oxygen ions and,
      an electrolytic tunnel barrier layer having a thickness less than approximately 50 Angstroms, the electrolytic tunnel barrier layer in direct contact with the conductive binary oxide layer; and
   a selection device including a layer of metal in contact with a single layer of doped polycrystalline silicon, the contact operative to form a single Schottky diode, the Schottky diode and the ME are electrically in series with each other and with the first and second terminals.

2. The memory device of claim 1, wherein the single layer of doped polycrystalline silicon is doped n−.

3. The memory device of claim 1, wherein the single layer of doped polycrystalline silicon includes a first portion that is doped n− and a second portion that is doped n+, the first portion is in contact with the layer of metal and the second portion is not in contact with the layer of metal.

4. The memory device of claim 3 and further comprising:
   an electrically conductive silicide layer in contact with the second portion.

5. The memory device of claim 4, wherein the silicide layer comprises a nickel silicide or a cobalt silicide.

6. The memory device of claim 1, wherein the metal layer comprises a metal selected from the group consisting of tungsten, aluminum, and platinum.

7. The memory device of claim 1, wherein one of the layers of the selection device is in direct contact with one of the layers of the ME.

8. The memory device of claim 1, wherein the first terminal is electrically coupled with a first conductive array line and the second terminal is electrically coupled with a second conductive array line.

9. The memory device of claim 8, wherein the first conductive array line comprises one of a plurality of first conductive array lines and the second conductive array line comprises one of a plurality of second conductive array lines and the plurality of first and second conductive array lines are disposed in a two-terminal cross-point array.

10. The memory device of claim 9, wherein the two-terminal cross-point array is positioned above, is in contact with, and is fabricated back-end-of-the-line (BEOL) directly above a semiconductor substrate including active circuitry fabricated front-end-of-the-line (FEOL) on the semiconductor substrate and electrically coupled with the plurality of first and second conductive array lines.

11. The memory device of claim 10 and further comprising:
    a plurality of the two-terminal cross-point arrays in contact with one another and vertically disposed over one another in a stacked configuration.

12. The two-terminal memory cell of claim 1, wherein the ME and the selection device are positioned above, are in contact with, and are fabricated back-end-of-the-line (BEOL) directly above a semiconductor substrate including active circuitry fabricated front-end-of-the-line (FEOL) on the semiconductor substrate and electrically coupled with the first and second terminals.

13. The two-terminal memory cell of claim 1, wherein the ME is configured to store at least one-bit of non-volatile data as a plurality of conductivity profiles that can be non-destructively determined by applying a read voltage across the first and second terminals, the data is retained in the absence of electrical power, and the data can be reversibly switched between a programmed conductivity profile and an erased conductivity profile by applying a write voltage across the first and second terminals.

14. The two-terminal memory cell of claim 13, wherein the selection device is configured to substantially block current flow through the ME for voltages other than the read voltage or the write voltage.

15. A memory device, comprising:
a first terminal;
a second terminal;
a re-writeable non-volatile two-terminal memory element (ME) including
a binary conductive oxide layer including mobile oxygen ions and,
an electrolytic tunnel barrier layer having a thickness less than approximately 50 Angstroms, the electrolytic tunnel barrier layer in direct contact with the conductive binary oxide layer; and
a selection device configured as a single Schottky diode including a single layer of an oxide semiconductor material, an ohmic metal in contact with the oxide semiconductor material, and a non-ohmic metal in contact with the oxide semiconductor material, the selection device and the ME are electrically in series with each other and with the first and second terminals.

16. The memory device of claim 15, wherein one of the layers of the ME is in contact with the ohmic metal or the non-ohmic metal.

17. The memory device claim 15 and further comprising:
a layer of metal in contact with the ohmic metal or the non-ohmic metal.

18. The memory device of claim 15, wherein the oxide semiconductor material comprises a perovskite.

19. The memory device of claim 18, wherein the perovskite comprises a doped strontium titanate.

20. The memory device of claim 19, wherein the strontium titanate is doped with niobium or lanthanum.

21. The memory device of claim 15, wherein the oxide semiconductor material comprises a binary oxide.

22. The memory device of claim 21, wherein the binary oxide comprises a material selected from the group consisting of nickel oxide, zinc oxide, and tin oxide.

23. The memory device of claim 15, wherein the ohmic metal comprises a material selected from the group consisting of magnesium, indium, aluminum, and tantalum.

24. The memory device of claim 15, wherein the non-ohmic metal comprises a material selected from the group consisting of platinum, palladium, and iridium.

25. The memory device of claim 15, wherein the first terminal is electrically coupled with a first conductive array line and the second terminal is electrically coupled with a second conductive array line.

26. The memory device of claim 25, wherein the first conductive array line comprises one of a plurality of first conductive array lines and the second conductive array line comprises one of a plurality of second conductive array lines and the plurality of first and second conductive array lines are disposed in a two-terminal cross-point array.

27. The memory device of claim 26, wherein the two-terminal cross-point array is positioned above, is in contact with, and is fabricated back-end-of-the-line (BEOL) directly above a semiconductor substrate including active circuitry fabricated front-end-of-the-line (FEOL) on the semiconductor substrate and electrically coupled with the plurality of first and second conductive array lines.

28. The memory device of claim 27 and further comprising: a plurality of the two-terminal cross-point arrays in contact with one another and vertically disposed over one another in a stacked configuration.

29. The memory device of claim 15, wherein the ME and the selection device are positioned above and fabricated back-end-of-the-line (BEOL) above a semiconductor substrate including active circuitry fabricated front-end-of-the-line (FEOL) on the semiconductor substrate and electrically coupled with the first and second terminals.

30. The memory device of claim 15, wherein the ME is configured to store at least one-bit of non-volatile data as a plurality of conductivity profiles that can be non-destructively determined by applying a read voltage across the first and second terminals, the data is retained in the absence of electrical power, and the data can be reversibly switched between a programmed conductivity profile and an erased conductivity profile by applying a write voltage across the first and second terminals.

31. The memory device of claim 30, wherein the selection device is configured to substantially block current flow through the ME for voltages other than the read voltage or the write voltage.

32. A two-terminal memory cell, comprising:
a first terminal;
a second terminal;
a re-writeable non-volatile two-terminal memory element (ME) including
a binary conductive oxide layer including mobile oxygen ions and,
an electrolytic tunnel barrier layer having a thickness less than approximately 50 Angstroms, the electrolytic tunnel barrier layer in direct contact with the conductive binary oxide layer; and
a selection device configured as a single Schottky diode including a single layer of an oxide semiconductor material in contact with a non-ohmic metal, the oxide semiconductor material including a graded doping profile having a doping concentration that is highest at an interface between the oxide semiconductor material and the non-ohmic metal, and the selection device and the ME are electrically in series with each other and with the first and second terminals.

33. An integrated circuit, comprising:
a substrate including active circuitry fabricated front-end-of-the-line (FEOL) on the substrate; and
at least one two-terminal cross-point memory array that is positioned above, is in contact with, and is fabricated back-end-of-the-line (BEOL) directly on top of the substrate, the array including a plurality of row lines, a plurality of column lines, and a plurality of memory cells with each memory cell positioned at an intersection of one of the row lines with one of the column lines and having a first terminal electrically coupled with its respective row line and a second terminal electrically coupled with its respective column line, each memory cell including electrically in series with its first and second terminals
a re-writeable non-volatile two-terminal memory element (ME) including a binary conductive oxide layer including mobile oxygen ions and, an electrolytic tunnel barrier layer having a thickness less than approximately 50 Angstroms, the electrolytic tunnel barrier layer in direct contact with the conductive binary oxide layer, and a selection device configured as a single Schottky diode including a single layer of a semiconductor material in contact with at least one layer of metal, the ME configured to store at least one-bit of non-volatile data as a plurality of conductivity profiles, the selection device configured to substantially block current flow through the ME for voltages other than voltages for data operations on the memory cell, the ME and the selection device are electrically in series with each other, and wherein the active circuitry is electrically coupled with the plurality of row lines and the plurality of column lines and is configured to generate the voltages for the data operations on one or more of the plurality of memory cells.

34. The integrated circuit of claim 33, wherein for a sector erase data operation, the active circuitry applies a first erase voltage potential to all row lines, applies a second erase voltage potential to all column lines, and the sector erase is operative to write an erased conductivity profile to all memory cells in the array.

35. The integrated circuit of claim 34, wherein application of the first erase voltage potential and the second erase voltage potential are operative to bias the selection device into reverse breakdown.

36. The integrated circuit of claim 33, wherein for a read data operation, the active circuitry applies a first read voltage potential to a selected row line and to un-selected column lines, applies a second read voltage potential to a selected column line and to un-selected row lines, and the read data operation is operative to read data stored in the memory cell having its first and second terminals electrically coupled with the selected row and column lines.

37. The integrated circuit of claim 33, wherein for a program data operation, the active circuitry applies a first program voltage potential to a selected row line and to un-selected column lines, applies a second program voltage potential to a selected column line and to un-selected row lines, and the program data operation is operative to write a programmed conductivity profile to the memory cell having its first and second terminals electrically coupled with the selected row and column lines.

38. The integrated circuit of claim 33, wherein the single layer of semiconductor material comprises a single layer of doped polycrystalline silicon.

39. The integrated circuit of claim 33, wherein the single layer of semiconductor material comprises a single layer of an oxide semiconductor material and the at least one layer of metal comprises a non-ohmic metal.

40. The integrated circuit of claim 39, wherein the oxide semiconductor material includes a graded doping profile having a doping concentration that is highest at an interface between the oxide semiconductor material and the non-ohmic metal.

* * * * *